US011862736B2

(12) United States Patent
Rittman et al.

(10) Patent No.: US 11,862,736 B2
(45) Date of Patent: *Jan. 2, 2024

(54) MULTI-DIMENSIONAL PHOTONIC INTEGRATED CIRCUITS AND MEMORY STRUCTURE HAVING OPTICAL COMPONENTS MOUNTED ON MULTIPLE PLANES OF A MULTI-DIMENSIONAL PACKAGE

(71) Applicant: GBT Technologies Inc., Santa Monica, CA (US)

(72) Inventors: Danny Rittman, Oceanside, CA (US); Aliza Schnapp, Beverly Hills, CA (US)

(73) Assignee: GBT Tokenize Corp., Santa Monica, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/109,291

(22) Filed: Feb. 14, 2023

(65) Prior Publication Data
US 2023/0207711 A1   Jun. 29, 2023

Related U.S. Application Data

(63) Continuation-in-part of application No. 17/876,981, filed on Jul. 29, 2022, which is a continuation of (Continued)

(51) Int. Cl.
   *H01L 31/02*   (2006.01)
   *H01L 21/48*   (2006.01)
   (Continued)

(52) U.S. Cl.
   CPC ...... *H01L 31/02021* (2013.01); *H01L 21/486* (2013.01); *H01L 23/481* (2013.01);
   (Continued)

(58) Field of Classification Search
   CPC ............. H01L 21/486; H01L 23/481; H01L 23/49827; H01L 23/5226; H01L 23/5384;
   (Continued)

(56) References Cited

U.S. PATENT DOCUMENTS 4,603,374 A   7/1986  Wasielewski
5,817,543 A   10/1998 McAllister et al.
(Continued)

OTHER PUBLICATIONS

International Search Report and Written Opinion dated Jan. 9, 2020 in related International Application No. PCT/US2019/050266.
(Continued)

*Primary Examiner* — Alonzo Chambliss
(74) *Attorney, Agent, or Firm* — Eric L. Lane; Green Patent Law

(57) ABSTRACT

Multi-dimensional photonic integrated circuits are provided, including a substrate having a first side and a second side, a multi-dimensional package having multi-dimensional planes, and one or more optical components connected to the first side and the second side of the substrate and on the multi-dimensional planes of the multi-dimensional package. The multi-dimensional planes include one or more horizontal sides and one or more vertical sides. One or more of the optical components are mounted on at least one of the horizontal sides of the multi-dimensional package and one or more of the optical components are mounted on at least one of the vertical sides of the multi-dimensional package. Hybrid systems of conventional multi-dimensional integrated circuits and multi-dimensional photonic integrated circuits also are provided.

21 Claims, 28 Drawing Sheets

Related U.S. Application Data application No. 17/102,928, filed on Nov. 24, 2020, now Pat. No. 11,411,127, which is a continuation of application No. 16/292,388, filed on Mar. 5, 2019, now Pat. No. 10,854,763.

(60) Provisional application No. 62/732,023, filed on Sep. 17, 2018, provisional application No. 62/732,026, filed on Sep. 17, 2018.

(51) Int. Cl.
| | | |
|---|---|---|
| *H01L 23/48* | (2006.01) | |
| *H01L 23/498* | (2006.01) | |
| *H01L 23/522* | (2006.01) | |
| *H01L 23/538* | (2006.01) | |
| *H01L 31/0475* | (2014.01) | |
| *H01L 25/065* | (2023.01) | |
| *H01L 23/00* | (2006.01) | |

(52) U.S. Cl.
CPC .... *H01L 23/49827* (2013.01); *H01L 23/5226* (2013.01); *H01L 23/5384* (2013.01); *H01L 23/5385* (2013.01); *H01L 25/0657* (2013.01); *H01L 31/0475* (2014.12); *H01L 24/97* (2013.01)

(58) Field of Classification Search
CPC ........... H01L 23/5385; H01L 31/02021; H01L 31/0475; H01L 25/0657
See application file for complete search history.

(56) References Cited

U.S. PATENT DOCUMENTS

| | | | |
|---|---|---|---|
| 6,033,931 | A | 3/2000 | Hoffman et al. |
| 6,054,757 | A | 4/2000 | Kobayashi et al. |
| 7,537,966 | B2 | 5/2009 | Connell et al. |
| 8,299,592 | B2 | 10/2012 | Suh et al. |
| 8,673,686 | B2 | 3/2014 | Lee |
| 9,379,091 | B2 | 6/2016 | England |
| 10,854,763 | B2 | 12/2020 | Rittman et al. |
| 11,411,127 | B2 * | 8/2022 | Rittman .............. H01L 23/5384 |
| 2004/0104469 | A1 | 6/2004 | Yagi |
| 2004/0108590 | A1 | 6/2004 | Kledzik et al. |
| 2004/0178514 | A1 | 9/2004 | Lee et al. |
| 2007/0023887 | A1 | 2/2007 | Matsui |
| 2010/0304521 | A1 * | 12/2010 | Seutter .............. H01L 31/03529 |
| | | | 257/E31.13 |
| 2012/0138997 | A1 * | 6/2012 | Tasaki ..................... H01L 33/60 |
| | | | 427/322 |
| 2012/0248595 | A1 | 10/2012 | Or-Bach |
| 2014/0111269 | A1 | 4/2014 | Huang |
| 2014/0293531 | A1 * | 10/2014 | Brooks .................. H05K 1/148 |
| | | | 361/679.02 |
| 2015/0123284 | A1 | 5/2015 | Jo |
| 2015/0282294 | A1 | 10/2015 | Wakuda et al. |
| 2016/0197235 | A1 * | 7/2016 | Sung ....................... H01L 33/20 |
| | | | 257/76 |
| 2018/0053544 | A1 | 2/2018 | Ware et al. |
| 2018/0096872 | A1 | 4/2018 | Cheng et al. |
| 2019/0122960 | A1 | 4/2019 | Lin |

OTHER PUBLICATIONS

Partial Supplementary European Search Report dated Sep. 2, 2022 in related European Patent Application No. 19862631.9.

* cited by examiner

MULTI-DIMENSIONAL PHOTONIC INTEGRATED CIRCUITS AND MEMORY STRUCTURE HAVING OPTICAL COMPONENTS MOUNTED ON MULTIPLE PLANES OF A MULTI-DIMENSIONAL PACKAGE

CROSS-REFERENCE TO RELATED APPLICATIONS

This application is a continuation-in-part of and claims priority to U.S. patent application Ser. No. 17/876,981, filed Jul. 29, 2022, which is a continuation of and claims priority to U.S. patent application Ser. No. 17/102,928, filed Nov. 24, 2020, issued as U.S. Pat. No. 11,411,127 on Aug. 9, 2022, which is a continuation of and claims priority to U.S. patent application Ser. No. 16/292,388, filed Mar. 5, 2019, issued as U.S. Pat. No. 10,854,763 on Dec. 1, 2020, which is a non-provisional of and claims priority to U.S. Patent Application No. 62/732,026, filed Sep. 17, 2018, and U.S. Patent Application No. 62/732,023, filed Sep. 17, 2018, each of which is hereby incorporated by reference in its entirety.

FIELD

The present disclosure relates to multi-dimensional photonic integrated circuits and their design and manufacturing. The present disclosure further relates to multi-dimensional, multi-planar memory architecture.

BACKGROUND

Electronic devices have become commodities in society today. The heart of every electronic device is a microchip or, as it called, an integrated circuit (IC). The development of IC technology is driven by the need to increase both performance and functionality while reducing power and cost. This goal has been achieved by two solutions: scaling devices and associated interconnecting wire. This is done through the implementation of new materials and processing innovations and through introducing architecture enhancements to reconfigure routing, hierarchy, and placement of critical circuit building blocks.

One of the most common electronic devices is the mobile phone. The prevalence of these mobile devices is driven in part by the many functions that are now enabled on such devices. Demand for such functions increases processing capability requirements and generates a need for more powerful batteries. Within the limited space of the housing of the mobile communication device, batteries compete with the processing circuitry. The limited space contributes pressure toward a continued miniaturization of components and control of power consumption within the circuitry. Though miniaturization has been of particular concern in the integrated circuits (ICs) of mobile communication devices, there also have been efforts at miniaturization of ICs in other devices.

While miniaturization efforts have progressed in general compliance with Moore's Law, the space savings achieved by shrinking the active components is almost immediately offset by IC designs that add additional active elements to provide increased functionality. In conventional two-dimensional (2D) designs, active elements within an IC have all been placed in a single active layer with elements interconnected through one or more metal layers that are also within the IC. As the number of active elements within an IC increases, the routing requirements to effectuate desired interconnections between elements become increasingly complex.

The difficulty in routing interconnections is particularly acute within complex circuitry elements such as memories and RF/analog circuits. A notable recent development in this field is three-dimensional integrated circuits, the 3D IC. In microelectronics, a "three-dimensional integrated circuit" is an integrated circuit manufactured by stacking silicon wafers and/or dies and interconnecting them vertically using through-silicon VIAs so that they behave as a single device to achieve performance improvements at reduced power and smaller footprint than conventional two-dimensional processes. Current 3D integration schemes rely on traditional methods of interconnect such as wire bonding and flip chip to achieve vertical stacks.

3D IC is just one of a host of 3D integration schemes that exploit the z-direction to achieve electrical performance benefits. They can be classified by their level of interconnect hierarchy at the global (package), intermediate (bond pad) and local (transistor) level. In general, 3D integration is a broad term that includes such technologies as 3D wafer-level packaging (3DWLP), 2.5D and 3D interposer-based integration, 3D stacked ICs (3D-SICs), monolithic 3D ICs, 3D heterogeneous integration, and 3D systems integration. International organizations such as the Jisso Technology Roadmap Committee (JIC) and the International Technology Roadmap for Semiconductors (ITRS) have worked to classify the various 3D integration technologies to further the establishment of standards and roadmaps of 3D integration.

Three-dimensional integrated circuits offer many benefits for future microprocessor designs. Among these is the potential for overcoming the barriers in interconnect scaling, thereby offering an opportunity to continue performance improvements using CMOS and other technologies. As the fabrication of 3D integrated circuits has become viable, new, challenging architectural, design and manufacturing techniques need to be overcome, leveraging the benefits of fast latency, higher bandwidth, and heterogeneous integration capability that are offered by 3D technology. The cost of 3D integration is also a factor that improves as technologies become more advanced.

Like 3D IC's, multi-dimensional memory is also a relatively new field, with focus on three-dimensional memory technology for about the past decade. Semiconductor memory is an electronic data storage device, often used as computer memory, implemented on a semiconductor-based integrated circuit. It is made in many different types and technologies. IC memory, in general, is categorized into two major types. RAM (Random Access Memory) is both readable and writable. It is volatile, which means it requires power in order to retain its contents. Computer programs and data typically are stored in disk files when they are not in use. When a program is run (executed), the program and the data it manipulates are loaded from disk into RAM, which is about 1,000,000 times faster than disk. This greatly improves speed when the same data is accessed repeatedly. The second major type of IC memory, ROM (Read-Only Memory), is not generally writable. The original ROMs were set to a specific content at the factory and could never be written again.

Today, we use EEPROM, or electronically erasable programmable ROMs, such as Flash memory. EEPROMS are writable, but not as easily as RAM. There are special procedures for altering the contents of an EEPROM. The important feature of ROM and EEPROM is that it is non-volatile, so it retains its content even when the power is cut. Non-volatile memory is used to store firmware, which is essentially software that stays in memory when the power is off. Firmware makes it possible for computers to start when the power is turned on (cold boot) and allows small and embedded devices which are often powered down to function. The boot sequence cannot be started from disk, since reading a program from disk requires a program. Hence, there must be a minimal amount of program code in memory when the power comes on to start the boot sequence. In a personal computer, the firmware, sometimes called BIOS (Basic Input/output System or Built-In Operating System), initializes the hardware and loads the first part of the operating system from disk. From there, the operating system takes over.

Integrated memory is an essential component within every electronic device today, especially in the mobile communication arena where they have become common. Demand for advanced functions increases processing capability requirements and generates a need for more powerful memory. Within the limited space of the housing of the mobile communication device, memory competes with the processing circuitry and the battery life. The limited space contributes pressure to a continued miniaturization of memory components and control of power consumption within the circuitry.

The difficulty in routing interconnections is particularly acute within the memory elements. That is, while smaller memory bit cells allow component miniaturization, increased functionality requires more available memory, and accordingly, more and more memory bit cells are assembled into memory banks for each device. As the number of memory bit cells within a memory bank increases, the access lines (such as the bit line (BL) or word line (WL)) for such bit cells become increasingly long. As the length of the access lines becomes longer, the difficulty in routing the lines increases.

Typically, memory banks may make use of a fully static complementary metal oxide semiconductor (CMOS) fabric switch consisting on inter-block routes, multiplexers and repeaters for client-to-client interaction. The use of such a fabric switch allows the memory pools to save metal route congestion. Even with such fabric switches, memory pools require crossbars (sometimes referred to as "xBar") as inter-block communication channels in 2D designs. These crossbars take up significant routing resources that compete with top-level routes. Additionally, these crossbars are typically millimeter(s) long. Such lengths necessitate the use of repeaters and have significant resistive-capacitive (RC) delay associated with them, limiting the memory access (or inter-block communication) time.

Three-dimensional memory (3D-M) is a monolithic semiconductor memory comprising a plurality of vertically stacked memory levels. It includes three-dimensional read-only memory (3D-ROM) and three-dimensional random-access memory (3D-RAM). The 3D-ROM can be further categorized into three-dimensional mask-programmed read-only memory (3D-MPROM) and three-dimensional electrically programmable read-only memory (3D-EPROM). Depending on its programming mechanism, 3D-M can comprise a memristor memory, a resistive random-access memory (RRAM or ReRAM), a phase-change memory (PCM), a programmable metallization memory (PMM), or a conductive-bridging random-access memory (CBRAM).

A traditional microchip is an integrated circuit that contains electronic components that form a functional circuit, e.g., microprocessors, controllers, GPUs, Memories, and more, with the electrical information and power inside the chip transferred via electron flux through the components and wires. The main disadvantage of electrons is the fact that they are negatively charged subatomic particles that interact with other electrons as well as other particles. These interactions slow electrons down as they move through ICs, limit the amount of information that can be transmitted, and generate heat, which causes energy losses.

A photonic integrated circuit (PIC), by contrast, is a chip that contains photonic components, which are components that work with light (photons). PICs use a laser source to inject light that drives the components, like turning on/off a typical electron-based CMOS transistor. In a CMOS transistor, electrons are injected to drive electronic components as in PICs light is used instead of electrons. While electronic circuits (electrons flux based) can contain extremely small wires (nanometer range), optical components need to be connected via waveguides (the most common type of two-dimensional waveguide is an optical fiber), which are currently in larger dimensions due to wavelength size. Today this limitation can be reduced using nanofiber waveguides (very small optical fiber).

An integrated photonic technology provides a solution to the limitations of electron-based chips with a major increase in capacity and data transmission speed. In addition, PICs offer advantages such as lower thermal effects, large integration capacity, and compatibility with existing processing flows that allow for high yield, volume manufacturing, and lower costs. Applications for integrated photonics are broad—from data communications and sensing to the automotive industry and aerospace. As electron-based microchips reach the edge of the nanometer scale, PICs have the potential to become the preferred future technology for data communications, IoT sensing, autonomous vehicles, and aerospace/aeronautics domains.

PICs offer numerous advantages over conventional integrated circuits including higher speed, greater bandwidth, and lower energy loss. Hybrid technologies utilizing both PICs and ICs as well as purely photonic circuits are advancing technology and science past the electronics age and into the future, pushing the boundaries of what is possible for telecommunications, computing, defense, and consumer technology.

The major disadvantage of PICs is their size. The current transistor density range on a conventional IC is within hundreds of millions of transistors, on an advanced nanometer node (7 nm, 5 nm). The nanometer scale enables the creation of small and efficient chips for our cellphones, computers, and wearables, within convenient sizes. PICs technology however is still only on the micron scale.

In view of the issues discussed above, there is a need for further development of 3D or multi-dimensional IC architecture to achieve benefits such as space savings and better routing interconnections. There is also a need for more powerful IC memory. There is a need for more powerful memory provided within the limited space of the mobile communication device and better routing interconnections among the ever-increasing number of memory bit cells assembled into memory banks for each device. There also is a need for a multi-dimensional, multi-planar chip architecture to overcome the scale drawback of PICs by enabling much higher optical circuits "real estate" area.

SUMMARY

The present disclosure, in its many embodiments, alleviates to a great extent the disadvantages of known integrated circuits and IC memory by providing new multi-dimensional integrated circuit architecture, design and methods as well as new concepts for IC memory technology. In addition, the present disclosure describes a multi-dimensional, multi-planar memory structure which enables the design of terabytes memory on the same space of gigabytes today.

Exemplary embodiments include multi-dimensional integration over all of an IC package's planes. Disclosed methods provide monolithic multi-dimensional integrated circuit manufacturing, construction and design methods that are applied on both sides of an electronic board and the utilization of all a package's planes for semiconductor circuitry. The multi-dimensional integrated circuit is built on both sides of an electronic board. The integrated circuit silicon wafer is located on all planes of the rectangular or square package for maximum area utilization. This type of structure enables multi-dimensional utilization of integrated circuits for all manufacturing processes.

The present disclosure also describes monolithic multi-dimensional, multi-plane memory structure designs and methods for integrated circuits. A multi-dimensional, multiple planar integrated circuit memory structure provides larger memory capacity on silicon dies and microchip packages. Exemplary embodiments employ crossbar architecture with tight-pitched vertical, horizontal and angled monolithic intertier vias (MIVs) for inter-unit routing and electrical connections.

Also disclosed herein are monolithic multi-dimensional, multi-plane memory structure for integrated circuits. Utilizing memory layout in multi-plane structure eliminating the use of long crossbars reduces the RC delay of the crossbars, and generally improves performance and speed. Further, elimination of the long crossbars makes conductor routing easier. The new crossbars architecture may be done using multiple-plane, e.g., beehive and honeycomb structure shapes. The MIVs are minimized to small run-length, can work without the need for repeaters (unlike the long crossbars), and control logic may be used to configure the memory banks based on use. The honeycomb/beehive structure enables shorter, efficient MIVs structure. Furthermore, multi-plane, multi-dimensional memory layout surface design enables further capacity to implement much larger memory cells amount on the same area. The combination of multi-dimensional, multi-plane integrated circuit's memory design creates a new standard to develop IC memories. On the same area that gigabytes were structured before, now terabytes sizes can be achieved.

Exemplary embodiments of monolithic multi-dimensional integrated circuits comprise an electronic board having a first side and a second side, a multi-dimensional electronic package having multiple planes, and one or more semiconductor wafers mounted on the first side and the second side of the electronic board and on the multiple planes of the electronic package. In exemplary embodiments, the semiconductor wafers are mounted on all planes of the electronic package and the electronic circuitry is configured in layers. Exemplary embodiments may comprise a plurality of layered integrated circuits on a single semiconductor wafer. In exemplary embodiments, the multiple planes and/or semiconductor wafers have a honeycomb shape. The semiconductor wafers may be cut into one more dies having a geometrical shape.

In exemplary embodiments, one or more crossbars are utilized to couple the circuitry units and allow communication between them. In exemplary embodiments, at least one horizontal crossbar communicates signals within a horizontal plane. Integrated circuits may further comprise at least one vertical crossbar communicatively coupling electronic circuitry units. At least one multi-direction crossbar may be provided to communicatively couple one or more electronic circuitry units in single plane to at least one vertical crossbar.

In exemplary embodiments, the one or more semiconductor wafers include one or more solar cells. The solar cells may comprise MEMS and/or on-chip solar cells. The concept of placing solar cells on a multi-plane structure is novel. Advantageously, utilizing MEMS chips and normal silicon chips can be a great value for solar displays. This allows the creation of watches that will not need charging. Also, all other conventional displays would become much more power efficient, which will create new standards in operating time. This could make the estimated time between charges on the order of months.

Exemplary embodiments of monolithic multi-dimensional integrated circuits may incorporate a monolithic multi-dimensional memory architecture. Multi-plane, multi-dimensional memory layout surface design enables further capacity to implement majorly larger memory cells amount on same area. The combination of multi-dimensional, multi-plane integrated circuit's memory design creates new standards to develop IC memories. Utilizing memory layout in multi-plane structure eliminating the use of long crossbars reduces the RC delay of the crossbars and generally improves performance and speed. Further, elimination of the long, unidirectional crossbars makes conductor routing easier. The new crossbars architecture is done in vertical, horizontal and angled directions, using multiple-plane, e.g., bee hive and honeycomb structure, shapes. The MIVs are minimized to small run-length, can work without the need for repeaters (unlike the long crossbars), and control logic may be used to configure the memory banks based on use.

In exemplary embodiments, monolithic multi-dimensional memory architecture comprises one or more tiers, one or more monolithic inter-tier vias spanning the one or more tiers, at least one multiplexer disposed in one of the tiers, and control logic determining whether memory cells are active and which memory cells are active and controlling usage of the memory cells based on such determination. Each tier has a memory cell, and the inter-tier vias act as crossbars in multiple directions. The multiplexer is communicatively coupled to the memory cell in the respective tier. A set of multiplexers at each tier and plane for block access may be used to shorten overall conductor length and reduce resistive-capacitive (RC) delay.

In exemplary embodiments of monolithic multi-dimensional memory architecture used with and incorporated into integrated circuits, the crossbars are configured in a bee hive structure and/or a honeycomb structure. The honeycomb/bee hive structure enables shorter, efficient MIVs structure and significantly increases the surface for memory cells implementation. Exemplary integrated circuits incorporating the memory architecture comprise an electronic board having a first side and a second side, a multi-dimensional electronic package having multiple planes, and one or more semiconductor wafers mounted on the first side and the second side of the electronic board and on the multiple planes of the electronic package. In exemplary embodiments, the semiconductor wafers are mounted on all planes of the electronic package and the electronic circuitry is configured in layers.

In exemplary embodiments of memory architecture, the control logic deactivates unused memory cells to conserve power. Memory architecture may further comprise one or both of a three-dimensional mask-programmed read-only memory or a three-dimensional electrically programmable read-only memory. In exemplary embodiments, one of the monolithic inter-tier vias acts as a horizontal crossbar communicating signals between memory cells within a single tier. In exemplary embodiments, one of the monolithic inter-tier vias acts as a vertical, horizontal or angled crossbar spanning tiers and communicatively coupling electronic memory units between tiers.

Exemplary methods of manufacturing 3D integrated circuits and memory structure are described herein. In exemplary methods, dies are used to fabricate disclosed multi-dimensional ICs, packages, and memory structures. More particularly, the manufacturing of the multi-dimensional IC may be done utilizing Die-to-Die, Die-to-Wafer or Wafer-to-Water methods. Many sub-dies that are located on a different plane divide the physical layout of the die. The sub-dies may be glued/mounted on different planes and connected via crossbar technology or electrical conductors via bumps on each sub-die. In this way the same area can be used efficiently to gain much larger surface for memory cells allocations. The silicon sub-dies can be of different manufacturing process node and can be connected vie crossbars or any other electrical conductor type.

Also disclosed herein are multi-dimensional photonic integrated circuits and hybrid systems comprising multi-dimensional integrated circuits and multi-dimensional photonic integrated circuits. Disclosed photonic integrated circuits use light-based wires that can be fiber optics or any other plastic or material that can function as a light-conducting medium within a silicon wafer or another type of substrate that is used to fabricate an IC. The circuits can be conventional silicon-based and photonic-based and the communication can be light-based or silicon-based or hybrid.

An exemplary embodiment of a multi-dimensional photonic integrated circuit comprises a substrate having a first side and a second side, a multi-dimensional package having multi-dimensional planes, and one or more optical components connected to the first side and the second side of the substrate and on the multi-dimensional planes of the multi-dimensional package. The multi-dimensional planes include one or more horizontal sides and one or more vertical sides. One or more of the optical components are mounted on at least one of the horizontal sides of the multi-dimensional package and one or more of the optical components are mounted on at least one of the vertical sides of the multi-dimensional package.

In exemplary embodiments, the optical components are mounted on all planes of the multi-dimensional package. The multi-dimensional planes may have a honeycomb shape. In exemplary embodiments, the optical components comprise waveguides and/or lasers. The optical components may be connected via optical fiber. In exemplary embodiments, the multi-dimensional photonic integrated circuit further comprises a laser source injecting light to drive the optical components. There may be one or more solar cells integrated within the photonic integrated circuit or used as on-chip solar cells, and the solar cells may be MEMS and/or on-chip solar cells.

An exemplary multi-dimensional photonic integrated circuit further comprises a monolithic multi-dimensional memory architecture. The monolithic multi-dimensional memory architecture comprises one or more tiers, one or more monolithic inter-tier vias spanning the one or more tiers, at least one multiplexer disposed in one of the tiers, and control logic. Each tier has at least one memory cell. The multiplexer is communicatively coupled to the memory cell in the respective tier. The control logic determines whether memory cells are active and which memory cells are active and controls usage of the memory cells based on such determinations.

In exemplary embodiments, the multi-dimensional photonic integrated circuit can use light sources like laser, high intensity LED, LED or any other similar light source. The multi-dimensional photonic integrated circuit may enable signals multiplexing via different frequencies transmission. Many different types of data can be transmitted via one light-based wire to different components/circuitries. A dedicated electronic circuit can control the light frequencies, and multiplexing sequences.

An exemplary embodiment of a multi-dimensional photonic integrated circuit comprises a substrate having a first side and a second side, a multi-dimensional electronic package having multiple planes, and one or more optical components connected to the first side and the second side of the substrate and on the multiple planes of the electronic package. The multiple planes have a honeycomb shape. In exemplary embodiments, the optical components are mounted on all planes of the electronic package. The optical components may be connected via optical fiber. The photonic integrated circuit may further comprise a laser source injecting light to drive the optical components.

An exemplary hybrid system of multi-dimensional integrated circuits and multi-dimensional photonic integrated circuits comprises at least one multi-dimensional integrated circuit and at least one multi-dimensional photonic integrated circuit. The multi-dimensional integrated circuit includes an electronic board having a first side and a second side, a multi-dimensional electronic package having multiple planes, and one or more semiconductor wafers mounted on the first side and the second side of the electronic board and on the multiple planes of the electronic package.

The multi-dimensional photonic integrated circuit includes a substrate having a first side and a second side, a multi-dimensional package having multiple planes, and one or more optical components connected to the first side and the second side of the substrate and on the multiple planes of the multi-dimensional package. The at least one multi-dimensional photonic integrated circuit is in communication with the at least one multi-dimensional integrated circuit via electrical communication and/or photonic communication.

In exemplary embodiments, the multiple planes of the multi-dimensional electronic package include one or more horizontal sides and one or more vertical sides. One or more of the semiconductor wafers may be mounted on at least one of the horizontal sides of the multi-dimensional electronic package, and one or more of the semiconductor wafers may be mounted on at least one of the vertical sides of the multi-dimensional electronic package. In exemplary embodiments, the multiple planes of the multi-dimensional electronic package have a honeycomb shape.

The multiple planes of the multi-dimensional package may include one or more horizontal sides and one or more vertical sides. One or more of the optical components may be mounted on at least one of the horizontal sides of the multi-dimensional package, and one or more of the optical components may be mounted on at least one of the vertical sides of the multi-dimensional package. In exemplary embodiments, the optical components are mounted on all planes of the multi-dimensional package. The optical components may comprise waveguides and/or lasers.

It should be noted that the advantages of disclosed multi-dimensional integrated circuits are significant. While traditional CMOS scaling processes improves signal propagation speed, scaling from current manufacturing and chip-design technologies is becoming more difficult and costly, in part because of power-density constraints, and in part because interconnects do not become faster while transistors do. Multi-dimensional ICs address the scaling challenge by stacking 2D dies and connecting them in multiple dimensions on every package's plane. This approach is far better than three dimensional (3D ICs) since it is utilizing all the IC package's planes as the wafer's base. This promises to speed up communication between layered chips, compared to planar layout.

Another advantage is fitting more functionality into a small space. This extends Moore's law and enables a new generation of tiny but powerful integrated circuits. We are achieving much larger silicon "real-estate." Partitioning a large chip into multiple smaller dies with multiple dimension location and stacking can improve the yield and reduce the fabrication cost if individual dies are tested separately. The integrated circuit's manufacturing can be done in many small parts, reducing defect ration and achieving higher yield.

Another significant advantage is the fact that the average wire length is reduced. Common figures reported by researchers are on the order of 10-15%, but this reduction mostly applies to longer interconnect, which may affect circuit delay by a greater amount. Given that multi-dimensional wires have much higher capacitance than conventional in-die wires, circuit delay may or may not improve.

Another object of the present disclosure and advantage is power consumption reduction. Keeping a signal on-chip can reduce its power consumption by 10-100 times. Shorter wires also reduce power consumption by producing less parasitic capacitance. Reducing the power budget leads to less heat generation, extended battery life, and lower cost of operation. Design flexibility enhancement is still another advantage; the horizontal and vertical dimension adds a higher order of connectivity and offers new design flexibilities and possibilities. Disclosed embodiments also provide security through obscurity because the stacked, multi-dimensional structure complicates attempts to reverse engineer the circuitry. Sensitive circuits may also be divided among the layers in such a way as to obscure the function of each layer.

Another major advantage of multi-dimensional integration is the large numbers of vertical VIAs between the layers. This allows construction of wide bandwidth routing buses between functional blocks in different layers. A typical example would be a microcontroller and memory multi-dimensional stack, with the cache memory stacked on top of the processor. This arrangement allows a bus much wider than the typical 128 or 256 bits between the cache and microcontroller. Wide buses in turn alleviate the memory wall problem. Another significant advantage is better heat dissipation and control due to the multiple-dimension structure. They provide higher flexibility for internal, silicon-based heat-sink design and implementation.

Advantageously, the disclosed 3D, multi-planar microchip architecture can be efficiently applied for PICs the same way as for conventional integrated circuits. The multi-planar shape structure solves the scale drawback of PICs by enabling much higher optical circuits "real estate" area. The multi-dimensional configuration also further increases the inter-circuits data transfer speed because optical circuits are at closer proximity to each other. More optical circuits could be placed on a substrate, creating much larger PICs with higher speed and functionalities.

The disclosed 3D, multi-planar microchip architecture also is an ideal solution for a hybrid technology combining photonics and conventional circuits. As pure PICs are still a developing technology, a hybrid solution is viable in the short term, offering photonic circuits working together with conventional ones. By utilizing disclosed embodiments, high complexity PICs and conventional infrastructure levels would be able to replace electron-based components to increase efficiency, and speed, rather than being used in a purely photonic system.

Accordingly, it is seen that 3D IC architectures and 3D memory structures are provided. These and other features of the disclosed embodiments will be appreciated from review of the following detailed description, along with the accompanying figures in which like reference numbers refer to like parts throughout.

BRIEF DESCRIPTION OF THE DRAWINGS

The foregoing and other objects of the disclosure will be apparent upon consideration of the following detailed description, taken in conjunction with the accompanying drawings, in which.

DETAILED DESCRIPTION

In the following paragraphs, embodiments will be described in detail by way of example with reference to the accompanying drawings, which are not drawn to scale, and the illustrated components are not necessarily drawn proportionately to one another. Throughout this description, the embodiments and examples shown should be considered as exemplars, rather than as limitations of the present disclosure.

As used herein, the "present disclosure" refers to any one of the embodiments described herein, and any equivalents. Furthermore, reference to various aspects of the disclosure throughout this document does not mean that all claimed embodiments or methods must include the referenced aspects. Reference to materials, configurations, directions, and other parameters should be considered as representative and illustrative of the capabilities of exemplary embodiments, and embodiments can operate with a wide variety of such parameters. It should be noted that the figures do not show every piece of equipment, nor the materials, configurations, and directions of the various circuits and communications systems.

Referring to FIGS. 1-4, exemplary embodiments of monolithic multi-dimensional integrated circuits will first be described. Exemplary ICs are built on both sides of an electronic board and have a multi-dimensional integration utilizing all if the IC package's planes for semiconductor circuitry. Thus, the IC architecture may be comprised of wafers located on any and all planes of a rectangular or square package for maximum area utilization. This type of structure enables multi-dimensional utilization of integrated circuits for all manufacturing processes.

Figure 1:
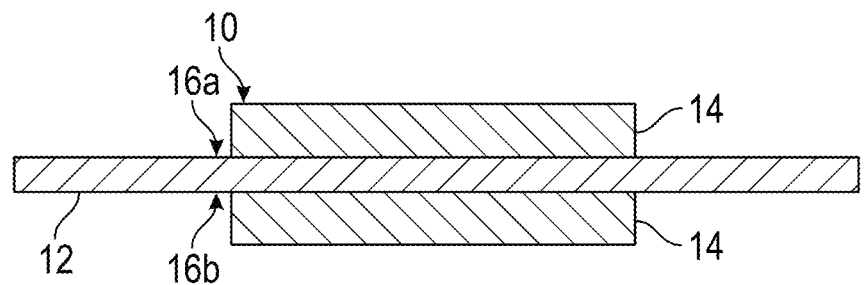
FIG. 1 is a schematic of an exemplary embodiment of a monolithic multi-dimensional integrated circuit in accordance with the present disclosure.

An exemplary monolithic multi-dimensional integrated circuit 10 comprises an electronic board 12 and one or more semiconductor wafers 14. The semiconductor wafers 14 may be any shape or may be of several different shapes. As discussed in more detail herein, in exemplary embodiments the multiple planes or the wafers have a honeycomb or beehive shape. As best seen in FIG. 1, the electronic board 12 has two opposite sides 16a, 16b, and IC 10 and wafers 14 are mounted on both sides 16a, 16b of the board 12. FIG. 1 shows a multi-dimensional integrated circuit cross-section mounted on electronic board. The multi-dimensional integrated circuit is located on both sides of an electronic board.

Figure 2:
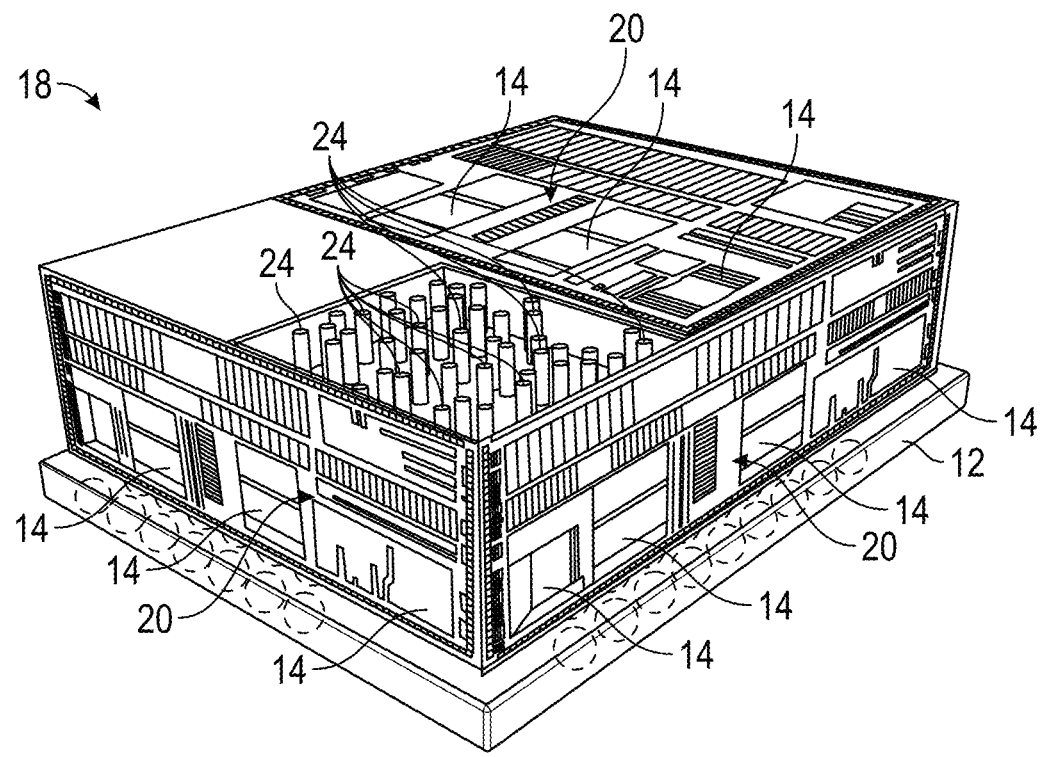
FIG. 2 is a schematic of an exemplary embodiment of a monolithic multi-dimensional integrated circuit in accordance with the present disclosure.
Figure 3:
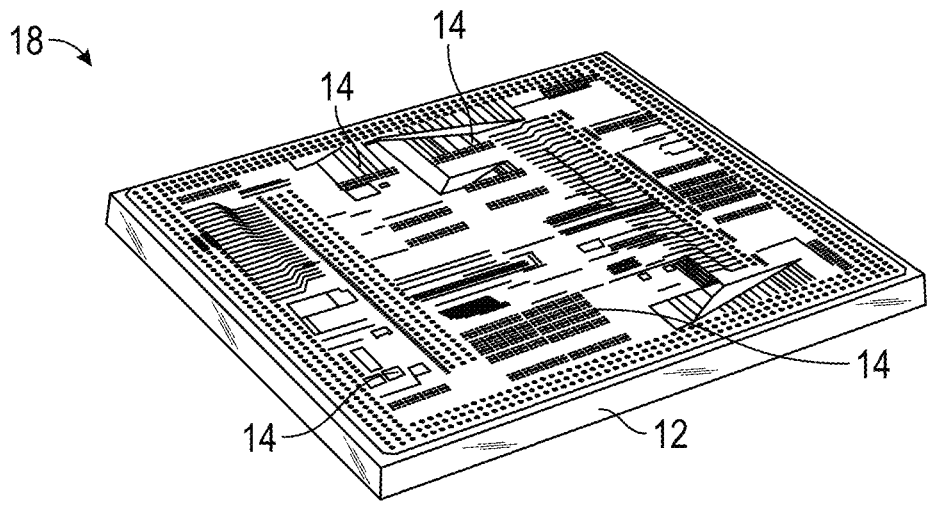
FIG. 3 is a schematic of an exemplary embodiment of a monolithic multi-dimensional integrated circuit in accordance with the present disclosure.

The semiconductor wafers 14 may be mounted on one or more of the planes 20 of the electronic package 18 and may be mounted on all its planes. In exemplary embodiments, multiple ICs are constructed on one or more planes of the electronic package 18. A multi-dimensional electronic package 18 is provided and is comprised of multiple planes 20a-20d, best seen in FIG. 4. Advantageously, any type of circuit could be placed on any plane of the multi-dimensional integrated circuit. This electronic circuitry could be designed hierarchically in layers. A plurality of layered integrated circuits could be placed on a single semiconductor wafer. As best seen in FIG. 2, a multi-dimensional integrated circuit 10 may contain semiconductor wafers 14 on multiple sides or on all sides. FIG. 3 demonstrates different wafer sizes.

Figure 4:
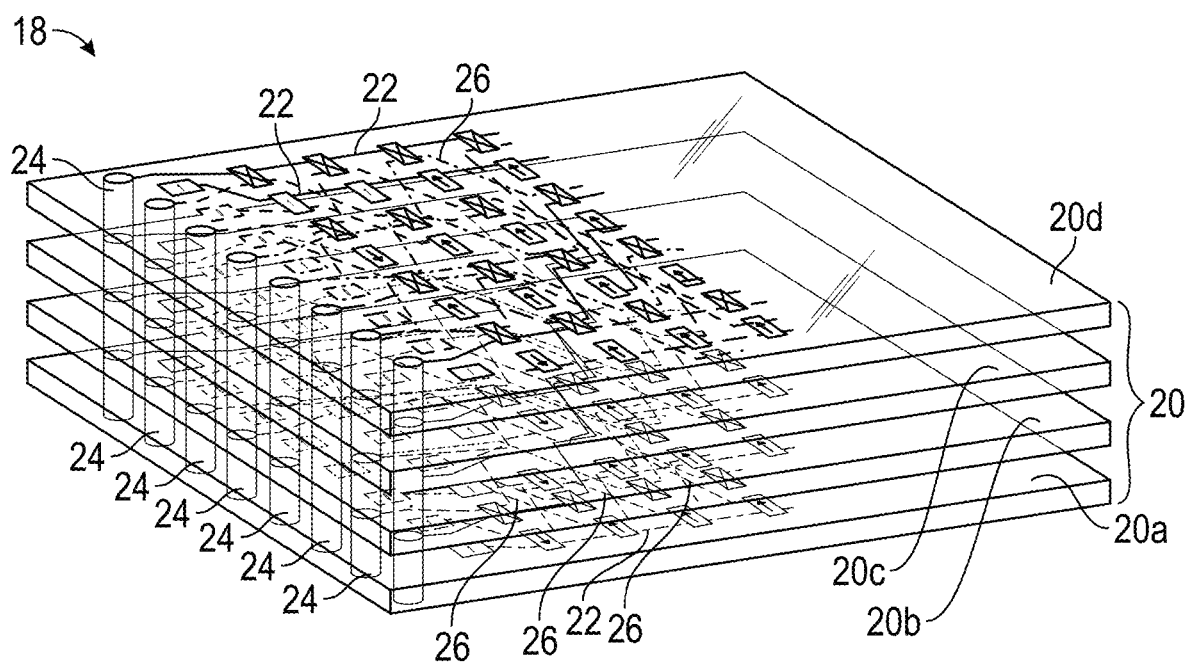
FIG. 4 is a schematic of an exemplary embodiment of a monolithic multi-dimensional integrated circuit in accordance with the present disclosure.

As shown in FIG. 4, an exemplary multi-dimensional IC 10 is comprised of a plurality of tiers or planes utilized for the electronic circuitry area, where the IC layout is designed to be electronically connected taking multi-dimensional planes into consideration. Each tier or plane may have electronic circuits, and a plurality of monolithic multi-dimensional wafers and circuits could be located on all planes, enabling efficient silicon area for maximum utilization. An internal, silicon based, heat-sink mechanism may provide advanced temperature control for the entire integrated circuit. FIG. 4 shows the inner horizontal and vertical connectivity.

Multiple monolithic IC units 10 are provided which are active and reconfigurable for different uses. One or more vertical crossbars 24 couple the circuitry units and allow communication between the units. Multi-directional crossbars 26 may be associated with a first tier of a plurality of tiers or planes. In exemplary embodiments, the multi-directional crossbars 26 couple a plurality of electronic circuitry units within a single tier to vertical crossbars 24. The crossbars may be centrally located in between the planes according to connectivity necessities. In exemplary embodiments, the multi-directional crossbars 26 support a shuffle architecture. The ICs may be connected to IO pads via internal metal wires that are routed in multi-dimensional planes. More particularly, the IC structure may include interconnects die side-side wire bars to connect between the silicon's internal connections and the IO PADs. In exemplary embodiments, the multi-dimensional electronic circuitry has crossed over power supplies to provide power to all integrated circuits on the wafer, in all planes.

As discussed above, improved interconnection is provided by an internal architecture comprised of horizontal, vertical and/or angled VIAs and cavities. FIG. 2 shows connected VIAs 24 running vertically from top to bottom. The internal connections described may support an in/out architecture. Metal crossbars 22, 24, 26 may cross side-to-side and top-down in order to perform the electronic connections that are necessary for the IC's circuitry. The multi-dimensional layout structure typically comprises vertical and horizontal connectivity on the order of microns long. In exemplary embodiments, at least one horizontal crossbar 22 communicates signals within a horizontal plane 20. A horizontal crossbar 22 may be provided for power supplies within a first tier or horizontal plane. One or more vertical crossbars 24 may be provided to provide communication between electronic circuitry units. As best seen in FIG. 4, in exemplary embodiments one or more multi-directional crossbars 26 communicate signals between one or more electronic circuitry units in a single plane to at least one vertical crossbar 24. In exemplary embodiments, at least one tier or plane comprises all-directions signals routings. In exemplary embodiments, each electronic circuitry unit is connected to the second tier that may be on any plane of the package, but the circuitry could be connected to any tier on any plane.

In exemplary embodiments, the integrated circuits are connected via multi-dimensional VIAs at all planes' levels. These "through-silicon VIAs" (TSVs) pass through the silicon substrate(s) between active layers and/or between an active layer and an external bond pad. The large numbers of vertical VIAs between the layers advantageously allows construction of wide bandwidth routing buses between functional blocks in different layers. A typical example would be a microcontroller and memory multi-dimensional stack, with the cache memory stacked on top of the processor. This arrangement allows a bus much wider than the typical 128 or 256 bits between the cache and microcontroller. Wide buses in turn alleviate the memory wall problem.

Disclosed embodiments provide methods of fabricating or manufacturing multi-dimensional or 3D integrated circuits and IC packaging. An exemplary method of forming a multi-dimensional circuitry structure in an IC includes positioning a first electronic circuit unit on a first tier or plane of a multi-dimensional IC and positioning a second electronic circuitry unit on a second tier or plane of the multi-dimensional IC. Third, fourth, and additional electronic circuitry units could be positioned on respective tiers or planes of the IC. The first electronic circuitry unit may be coupled to the second electronic circuitry unit with vertical crossbars. In exemplary embodiments, one or more multi-directional crossbars are provided within one of the electronic circuit's units at all planes. Control logic may be provided and configured to determine which, if any, electronic circuits within the first and second electronic circuit units are active and to reconfigure usage of the units based on such determination by deactivating those units that are not active.

In exemplary embodiments, monolithic multi-dimensional ICs are built in layers on a single semiconductor wafer, which is then diced into many sub-ICs. The semiconductor wafers can be cut into one more dies having a geometric shape. Advantageously, the fabrication can be done with only one substrate, eliminating the need for aligning, thinning, bonding, or through-silicon VIAs. Process temperature limitations may be addressed by partitioning the transistor fabrication to two phases. A high temperature phase can be done before layer transfer followed by a layer transfer use ion-cut, also known as layer transfer. Multiple thin (e.g., 10s-100s nanometer scale) layers of virtually defect-free silicon can be created by utilizing low temperature (<400° C.) bond and cleave techniques and placed on top of active transistor circuitry. This would be followed by finalizing the transistors using etch and deposition processes. This monolithic multi-directional IC technology can be done as a three-dimensional IC but on all the package's planes. In this way sub-wafers can be placed on the top, bottom, left and right of the package's planes and it therefore maximizes the area utilization of the IC's.

The manufacturing of the multi-dimensional IC may be done utilizing Die-to-Die, Die-to-Wafer or Wafer-to-Water methods, depending on the needs and goals of the manufacturer and based on the knowledge of the skilled artisan. Each manufacturing methodology has its advantages and disadvantages according to the design process and node's size. In the Die-to-Die method the electronic components are built on multiple dies, which are then aligned and bonded. Thinning and TSV creation may be done before or after bonding. One advantage of die-to-die is that each component die can be tested first, so that one bad die does not ruin an entire stack. Moreover, each die in the 3D IC can be binned beforehand, so that they can be mixed and matched to optimize power consumption and performance (e.g., matching multiple dice from the low power process corner for a mobile application).

In Die-to-Wafer the electronic components are built on two semiconductor wafers. One wafer is diced; the singulated dice are aligned and bonded onto die sites of the second wafer. As in the wafer-on-wafer method, thinning and TSV creation are performed either before or after bonding. Additional dies may be added to the stacks before dicing. In the multi-dimensional IC, the same technique is used but for multiple sub-wafers that are located on all the package's planes.

In the Wafer-to-Wafer manufacturing technique the electronic components are built on two or more semiconductor wafers, which are then aligned, bonded, and diced into the multi-dimensional ICs. Each wafer may be thinned before or after bonding. Vertical connections are either built into the wafers before bonding or created in the stack after bonding. These "through-silicon VIAs" (TSVs) pass through the silicon substrate(s) between active layers and/or between an active layer and an external bond pad. Wafer-to-wafer bonding can reduce yields, since if any 1 of N chips in a multi-dimensional IC is defective, the entire 3D IC will be defective. Moreover, the wafers must be the same size, but many exotic materials (e.g. III-Vs) are manufactured on much smaller wafers than CMOS logic or DRAM (typically 300 mm and below), complicating heterogeneous integration. The sub-wafer's layers can be built with different processes, or even on different types of wafers. This means that components can be optimized to a much greater degree than if they were built together on a single wafer. Moreover, components with incompatible manufacturing could be combined in a single multi-dimensional IC.

An exemplary method of manufacturing a multi-dimensional IC packaging comprises first forming an outer circuit having a top side and a bottom side and mounting an IC aside of the bottom side. Then device connectors are attached to the IC. An encapsulation is formed which has an encapsulation top side and an encapsulation bottom side so the encapsulation bottom side is partially exposed and the encapsulation is directly on the device connector and over the IC. Exemplary methods further include the step of forming a vertical interconnect through the encapsulation so the vertical interconnect has an interconnect bottom side directly on the outer circuit side and an interconnect top side exposed from the encapsulation. Forming the encapsulation may include forming it so it has an encapsulation plane on the bottom, top, left and right sides directly and connect them all via routing. In exemplary embodiments, forming the encapsulation includes forming an encapsulation cavity with the outer contact pad within the encapsulation cavity.

Then an external connector may be attached on a side of the outer circuit opposite the outer circuit top side with the vertical interconnect directly thereon. In exemplary embodiments, manufacturing methods include providing a package substrate having a substrate top side with the IC thereover so the substrate top side is coplanar with the outer pad top side. The method may include forming left- and right-side circuits that connect to all other circuitry on all planes. All circuits of the IC on all planes may include inner connections to the IO PADS.

Turning to FIGS. 5-11, exemplary embodiments of a monolithic multi-dimensional memory architecture will now be described. Monolithic multi-dimensional memory architecture 110 generally is comprised of a multi-dimensional, multiple plane memory crossbar architecture with tight-pitched vertical, horizontal and angled monolithic inter-tier vias (MIVs) 114 for inter-unit routing and multiplexers at each tier for block access are used to shorten overall conductor length and reduce resistive-capacitive (RC) delay. More particularly, exemplary embodiments have one or more tiers or planes 112 and monolithic inter-tier vias 114 spanning the tiers.

Figure 5:
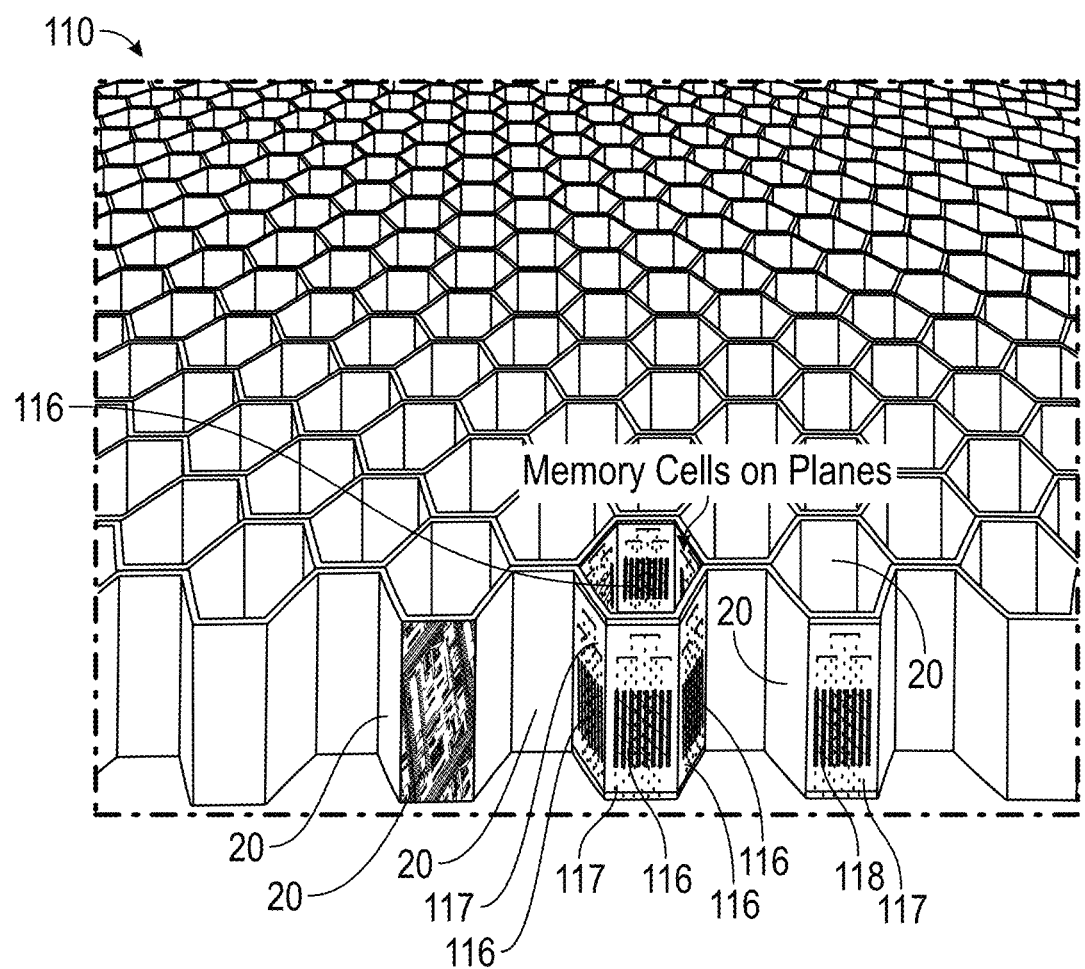
FIG. 5 is a schematic of an exemplary embodiment of a monolithic multi-dimensional memory architecture in accordance with the present disclosure.

As shown in FIG. 5, memory cells may be placed on a honeycomb structure. Silicon sub-dies can be placed on all honeycomb planes and connected via crossbars or other electrical conductors. In exemplary embodiments, there is at least one memory cell 116 in each tier or plane 112 and the memory cell 116 may be located within a client memory unit 117. At least one tier memory unit may lie in planes perpendicular to the other memory units and/or in planes parallel to the other memory units and/or in planes at any angle to the other memory units. A basic structure would have at least one horizontal crossbar for memory cells 116 within tiers 112. In exemplary embodiments, a stack of memory integrated circuit memory chips, each containing memory circuitry, are located on multi-planar structure and connected via vertical, horizontal and angled crossbars. The memory cells 116 may have random access memory (RAM), and the RAM may comprise static RAM (SRAM). In exemplary embodiments, one or more of the memory cells 116 could have a three-dimensional mask-programmed read-only memory (3D-MPROM) or a three-dimensional electrically-programmable read-only memory (3D-EPROM).

Figure 6:
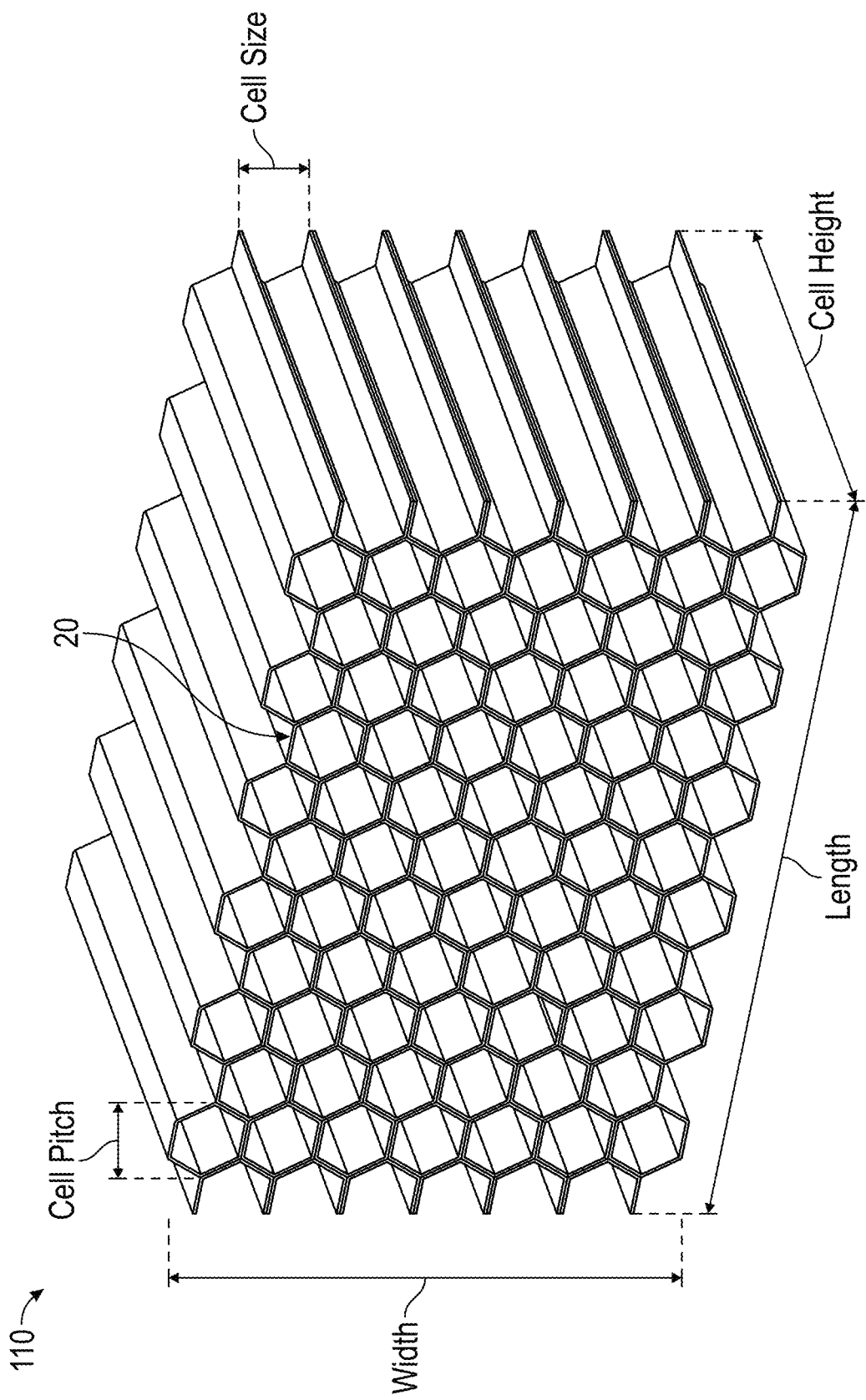
FIG. 6 is a schematic of an exemplary embodiment of a monolithic multi-dimensional memory architecture in accordance with the present disclosure.
Figure 7:
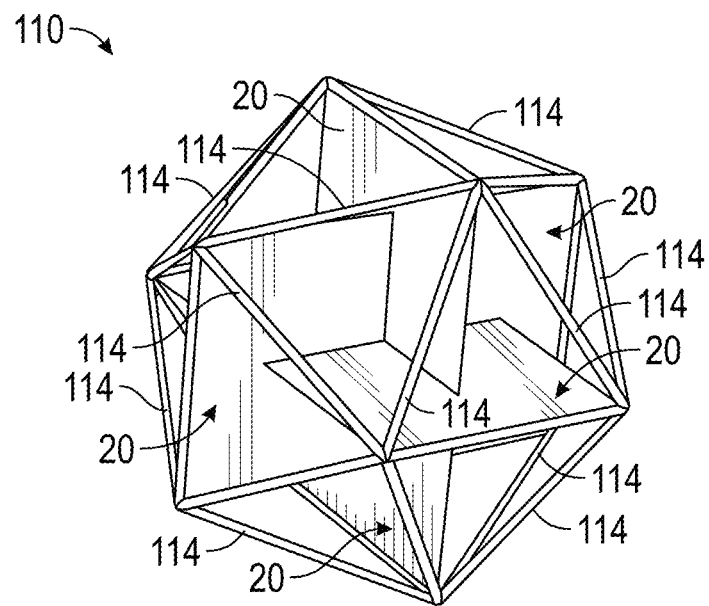
FIG. 7 is a schematic of an exemplary embodiment of a monolithic multi-dimensional memory architecture in accordance with the present disclosure.
Figure 8:
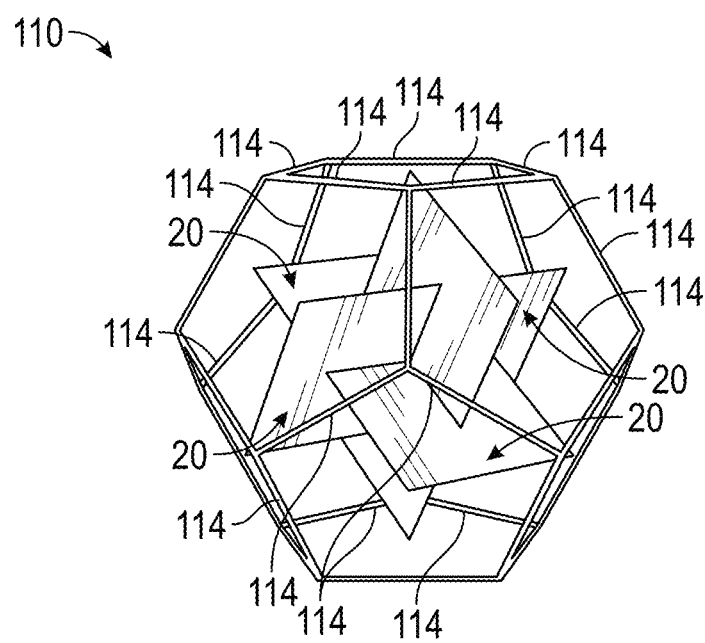
FIG. 8 is a schematic of an exemplary embodiment of a monolithic multi-dimensional memory architecture in accordance with the present disclosure.

FIGS. 6-8 illustrate multi-planar structures for memory cells allocation. FIG. 6 shows one plane within a honeycomb structure 125. FIG. 7 shows an exemplary structure comprised of multiple planes 112 and monolithic inter-tier vias 114 spanning the planes 112. Silicon sub-dies may be glued/mounted to these planes enabling significantly higher surface area for memory cells allocation. Another planar structure for memory cells allocations is shown in FIG. 8, also having multiple planes 112 and monolithic inter-tier vias 114 spanning the planes 112. Silicon sub-dies are glued/mounted on each plane, significantly enhancing the surface area for memory cells allocation.

Exemplary crossbar architecture uses multiple plane, horizontal, vertical and/or angled structures, in some instances, bee hive or honeycomb structure 125 shape. The MIVs 114 may be minimized to small run-length, in all directions, and connect circuits on multiple planes and therefore can work without the need for repeaters. The plurality of MIVs 114 may be configured to act as crossbars in all directions for the memory structure and may comprise a vertical, horizontal or angled length on the order of microns long. In exemplary embodiments, a vertical, horizontal or angled crossbar is associated with a first tier, and the vertical, horizontal or angled crossbar couples a plurality of client memory units within a single tier to the vertical, horizontal, or angled crossbar.

Figure 9:
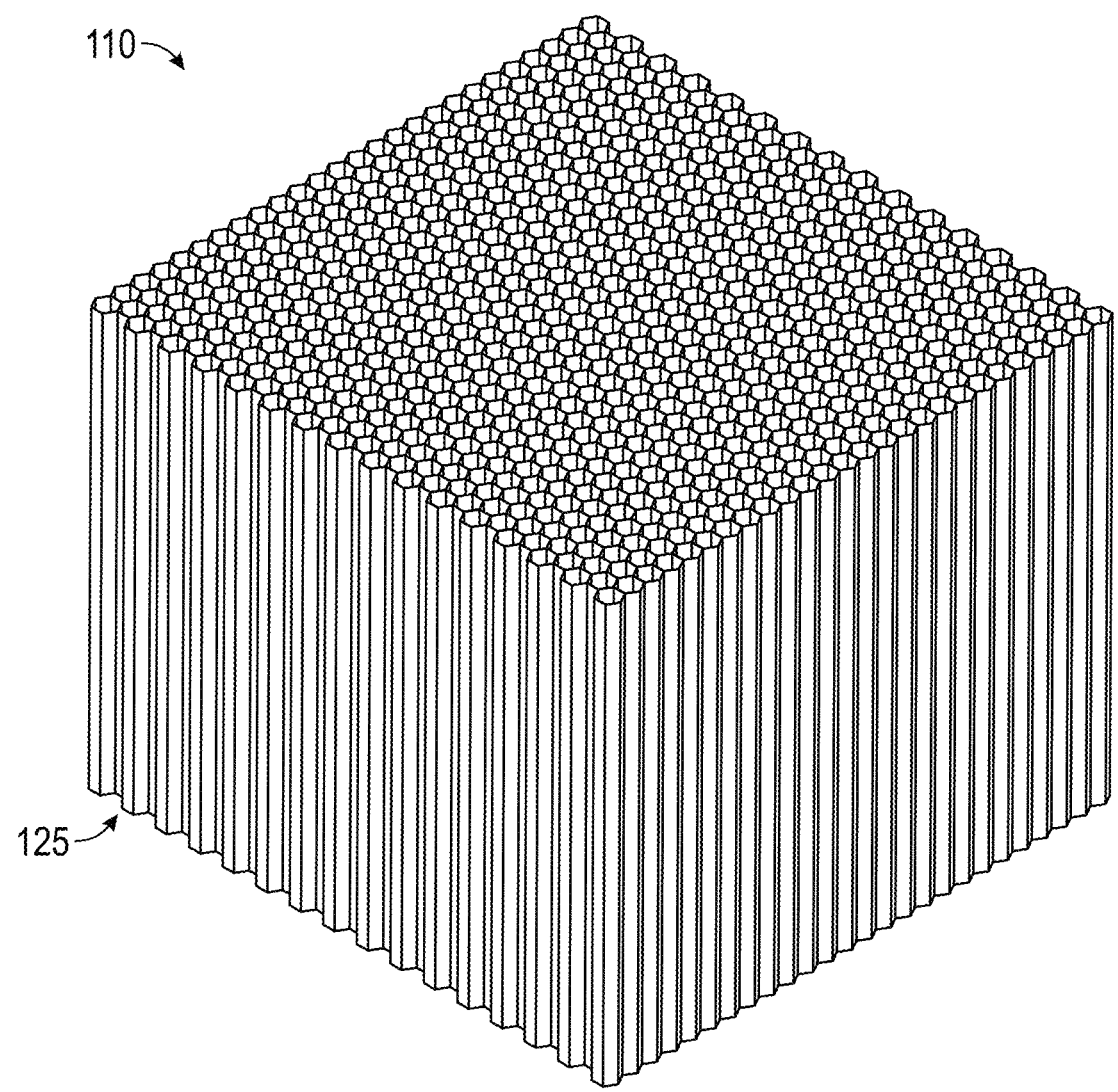
FIG. 9 is a schematic of an exemplary embodiment of a honeycomb-shaped monolithic multi-dimensional memory architecture in accordance with the present disclosure.
Figure 10:
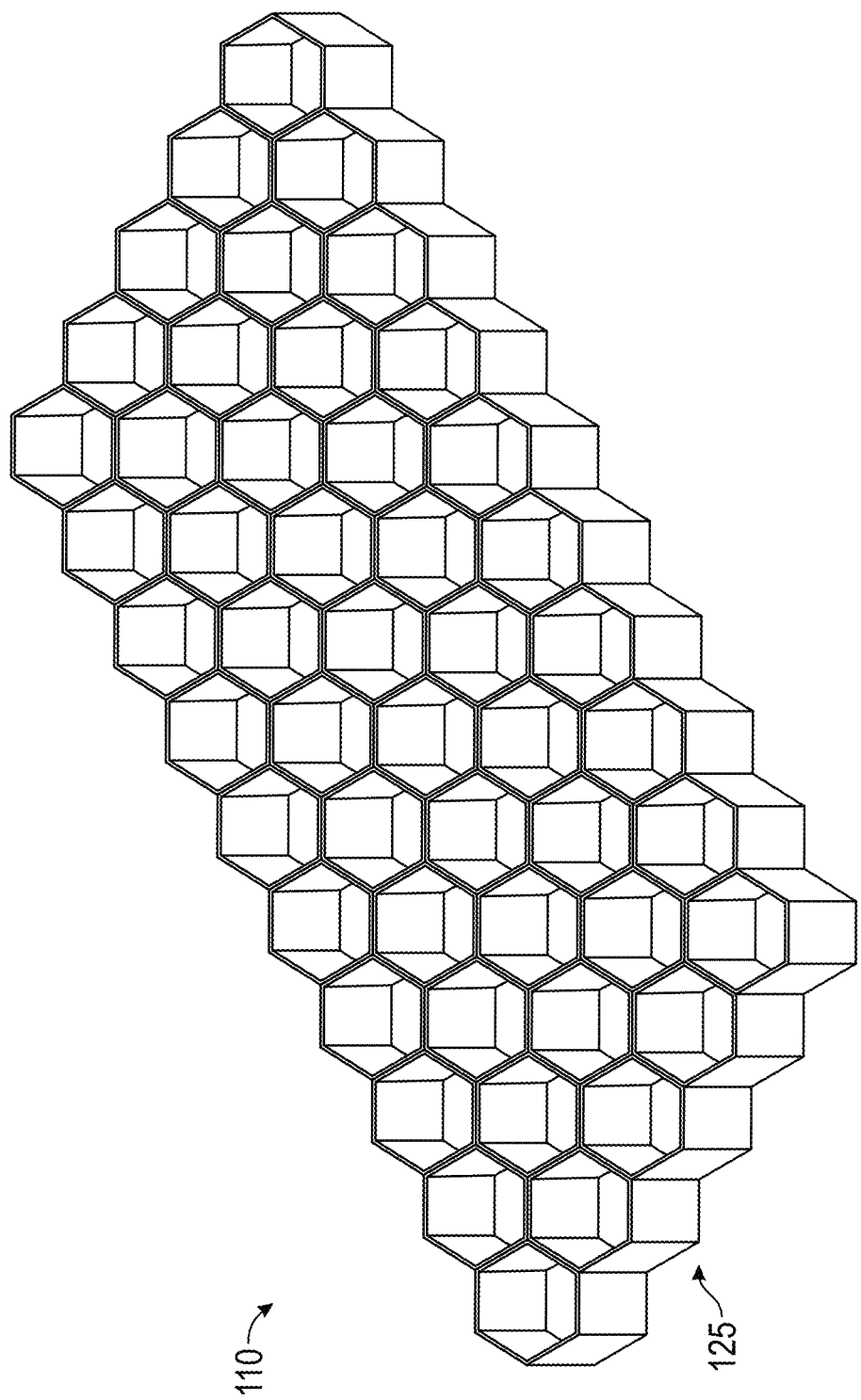
FIG. 10 is a schematic of an exemplary embodiment of a honeycomb-shaped monolithic multi-dimensional memory architecture in accordance with the present disclosure.

The honeycomb/bee hive structure, illustrated in FIGS. 9 and 10 advantageously enables shorter, more efficient MIV structure. Silicon sub-dies can be placed on the honeycomb planes. Implementation of this type of structural design for memory silicon dies significantly increases the surface area for memory cells implementation. The multi-plane, multi-dimensional memory layout surface design advantageously enables significantly larger capacity to implement more memory cells on the same area than current industry standard structures.

Figure 11:
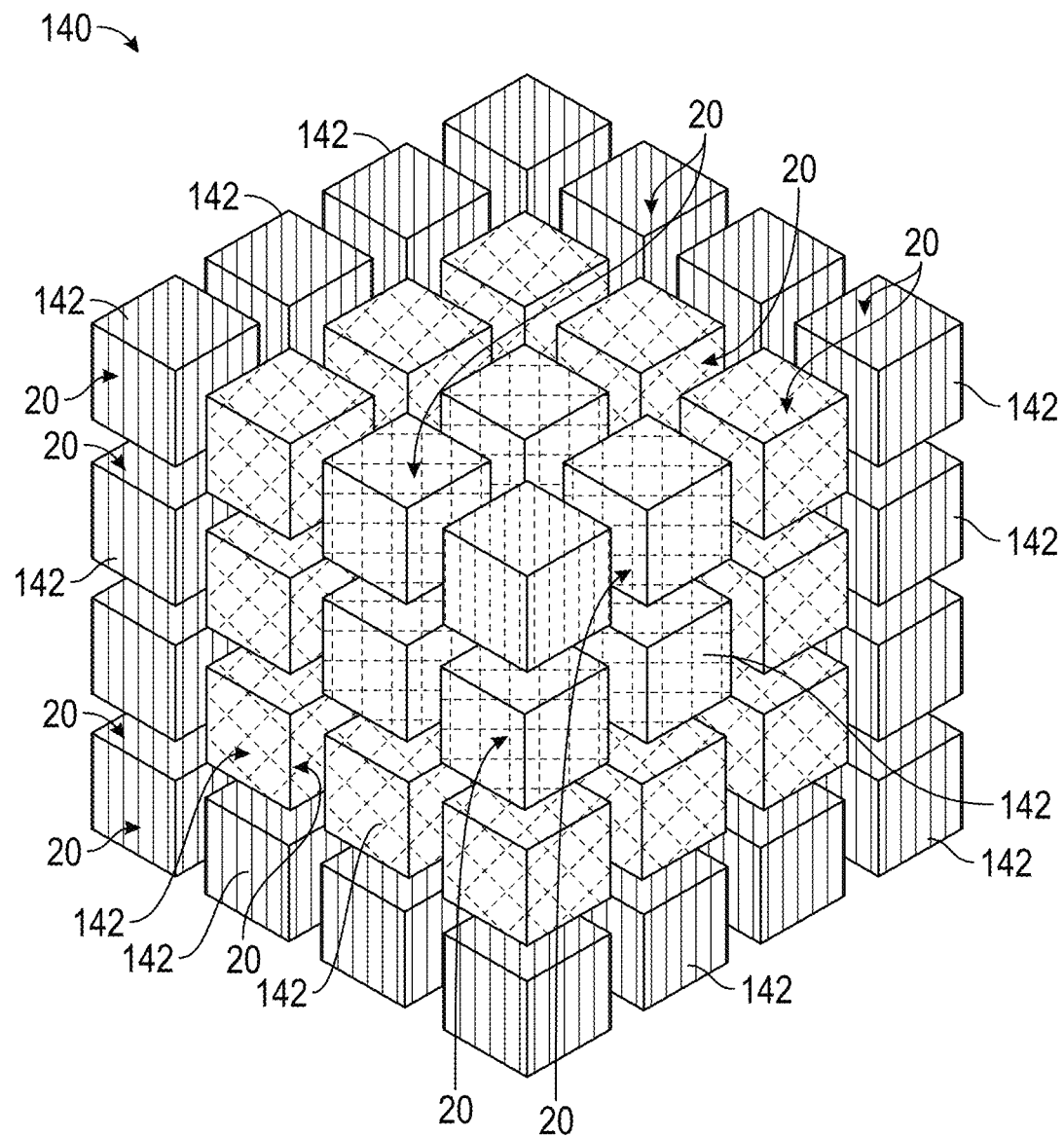
FIG. 11 is a schematic of an exemplary embodiment of a cube-shaped monolithic multi-dimensional memory architecture in accordance with the present disclosure.

In FIG. 11, surface division for memory cells allocation is illustrated with a cube and sub-cube structure. The main cube 140 is constructed of many sub-cubes 142. On each sub-cube's plane 112, memory cells can be placed. The sub-cubes' planes 112 are covered with memory cells sub-dies. All sub dies are connected via crossbars or any other conductor technology.

Figure 12:
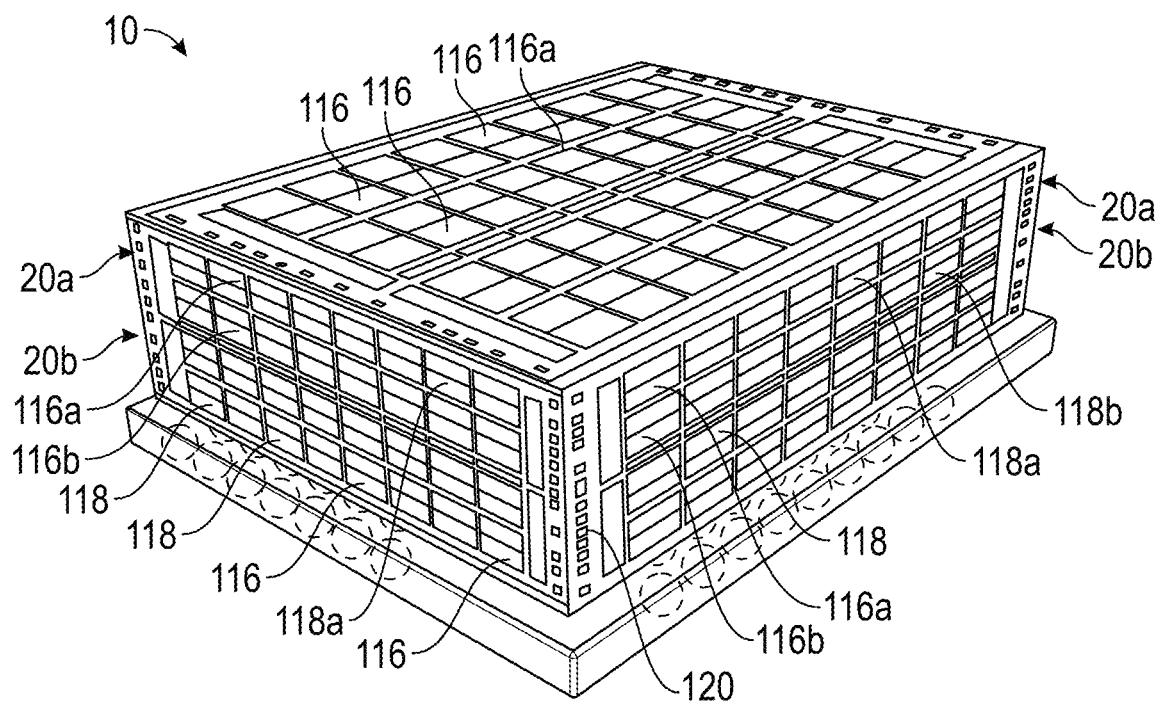
FIG. 12 is a schematic of an exemplary embodiment of a monolithic multi-dimensional memory architecture incorporated into an exemplary monolithic multi-dimensional integrated circuit in accordance with the present disclosure.

In exemplary embodiments, as shown in FIG. 12, a multiplexer 118 is disposed in one of the tiers or in multiple tiers. The multiplexer 118 is communicatively coupled to the memory cell 116 in the respective tier 112. In exemplary embodiments, a second multiplexer 118a is disposed in a second tier or plane among a plurality of tiers and coupled to a second respective memory cell 116a within the second tier. Control logic 120 may be used to configure the memory banks based on use. More particularly, control logic may be used to determine whether the memory cells 116 are active and which memory cells 116 are active and to control usage of the memory cells 116 based on such determinations. In exemplary embodiments, the control logic is configured to reconfigure usage of memory cells deactivates unused memory cells so that power is conserved.

Figure 13:
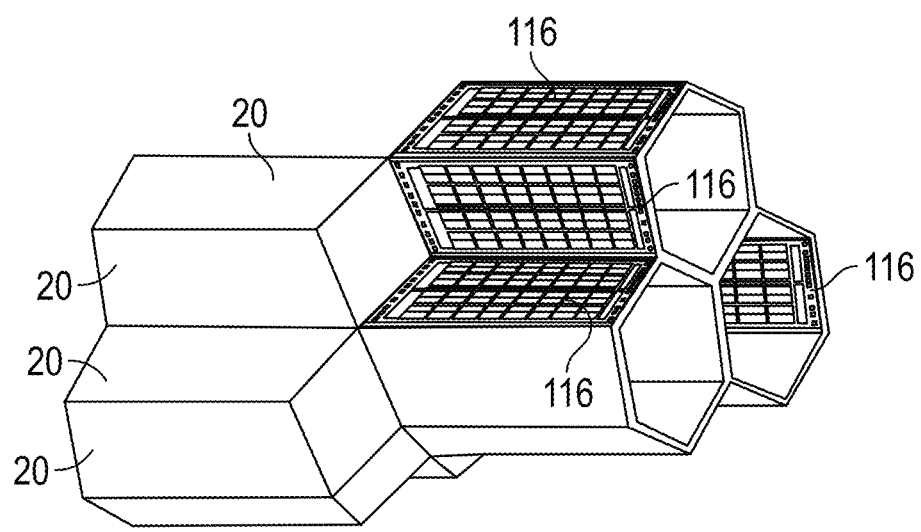
FIG. 13 is a perspective view of a honeycomb-shaped monolithic multi-dimensional memory architecture in accordance with the present disclosure.

With reference to FIGS. 12 and 13, multi-dimensional memory structures can be incorporated into multi-dimensional ICs. As discussed above, such memory structure has a plurality of planes 112, and each plane has at least one memory cell 116. Monolithic intertier vias (MIVs) 114 span the planes 112. A first multiplexer 118a may be disposed in a first plane 112a and coupled to at least a respective memory cell 116a within the first plane, and a second multiplexer 118b may be disposed in a second plane 112b and coupled to at least a second respective memory cell 116b within the second plane. Control logic 120, as discussed above, may be coupled to at least one of the MIVs 114.

In exemplary embodiments, the stack of memory units is located on multiple planes in multiple dimensions. As discussed above, a series of memory units may be arranged in a bee hive or honeycomb structure and connected via vertical, horizontal or angled crossbars, creating a memory structure having multiple planes in multiple dimensions. The series of memory units may be held together by glue or another adhesive to make one memory microchip. The IC may be comprised of silicon sub-dies of memory cells, each glued/mounted on a different plane and connected via crossbars or any other electrical conductor. The silicon sub-dies may be on different planes and can be on different manufacturing process nodes and connected via crossbars or any other electrical conductor. In exemplary embodiments, the series of memory units is structurally integrated to a microprocessor chip to constitute a microprocessor and a memory module.

Exemplary multi-dimensional, multi-planar memory ICs may incorporate different types of memory. For example, the IC may have a multi-dimensional read-only memory (ROM) or a multiple-dimensional random-access memory (RAM). In exemplary embodiments, the IC has a multi-dimensional Flash memory. An IC may have one or more of a memristor, a resistive random-access memory (RRAM or ReRAM), a phase-change memory (PCM), a programmable metallization cell (PMC), and a conductive-bridging random-access memory (CBRAM).

Exemplary methods of manufacturing and forming a multi-dimensional memory integrated circuit (IC) memory structure will now be described. In exemplary embodiments, a first step is positioning a first client memory unit 117a on a first plane 112a of a multi-dimensional memory integrated circuit 10. Next, a second client memory unit 117b is positioned on a second plane 112b of the multi-dimensional memory integrated circuit. At least one vertical, horizontal or angled crossbar 22, 24, 26, 114 may be provided within one of the client memory units 117.

Subsequent steps include coupling the first client memory unit 117a to the second client memory unit 117b with a vertical, horizontal or angled crossbar 22, 24, 26, 114 and providing control logic 120. As discussed above, the control logic 120 is configured to determine which, if any, memory cells 116 within the first and second client memory units 117 are active and reconfigure usage of the client memory units 117 based on such determination by deactivating client memory units which are not active. As mentioned above, dies are used in manufacturing disclosed multi-dimensional ICs and packages, and the multi-dimensional die and said intermediate-circuit dies may be located in a memory package, a memory module, a memory card or a solid-state drive.

Figure 14:
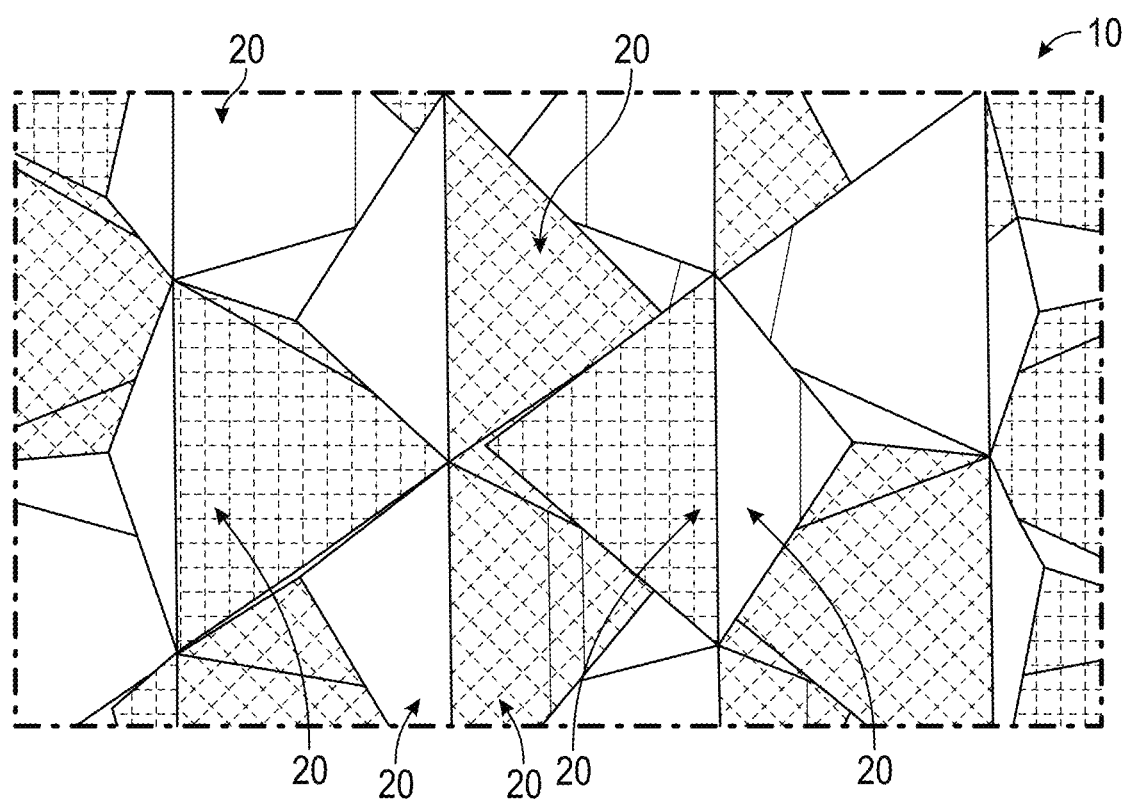
FIG. 14 is a schematic of an exemplary embodiment of a monolithic multi-dimensional integrated circuit in accordance with the present disclosure.

Turning to FIGS. 14-18, monolithic multi-dimensional integrated circuits incorporating solar cells will now be described. Generally, solar cells and/or MEMS can be mounted on or incorporated into the multiple-planes wafers described above for purposes of charging various devices. Advantageously, as the number of surfaces increases the battery power time is significantly higher. The solar cells can be produced as MEMS or on-chip solar cells based on nanotechnology research and development. FIG. 14 illustrates an exemplary multi-dimensional integrated circuit having multiple planes 20 suitable for on-chip solar cells.

Figure 15:
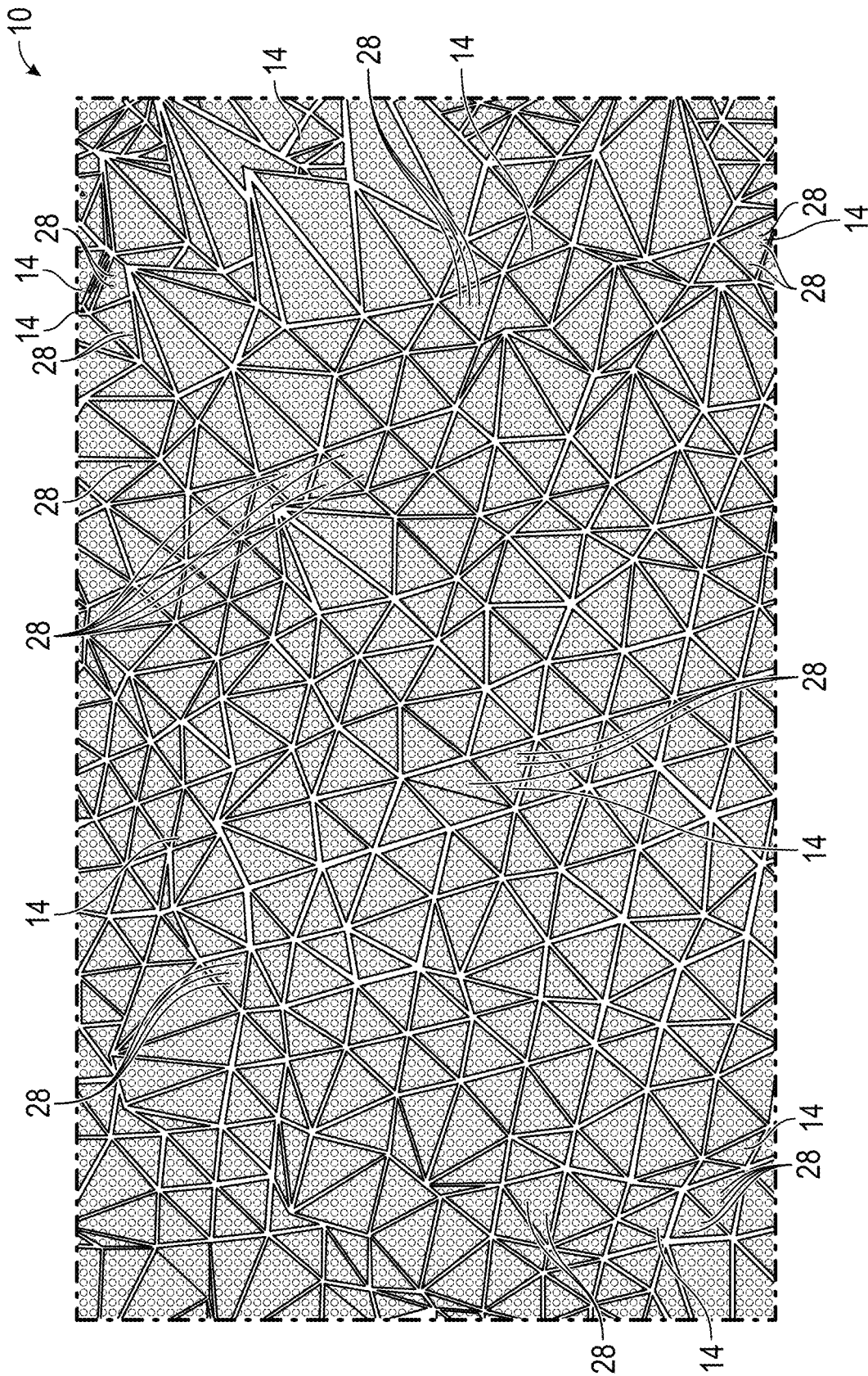
FIG. 15 is a schematic of an exemplary embodiment of a monolithic multi-dimensional integrated circuit with solar cells in accordance with the present disclosure.
Figure 16:
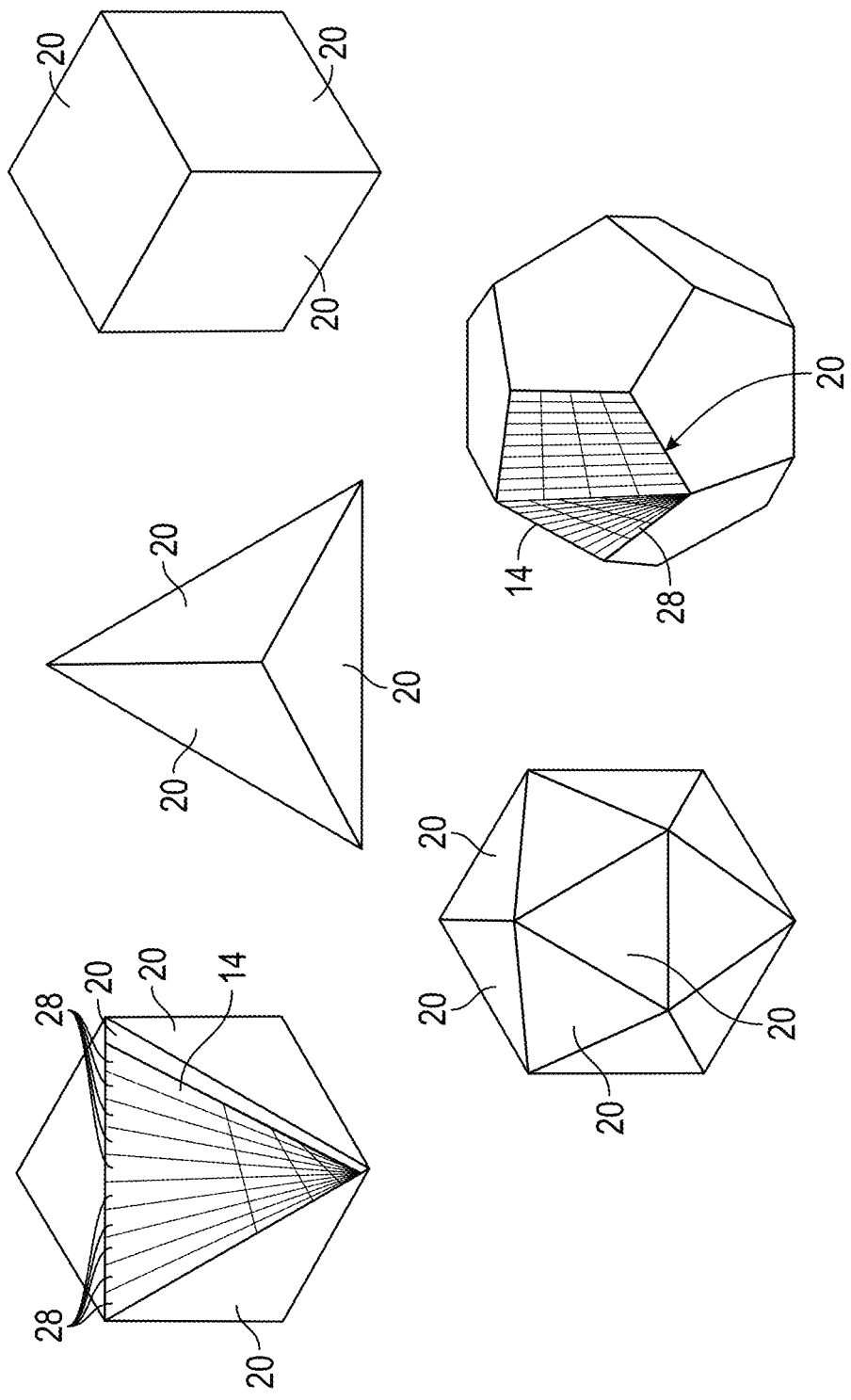
FIG. 16 is a schematic of exemplary embodiments of semiconductor wafers with solar cells on multi-dimensional surfaces in accordance with the present disclosure.
Figure 17:
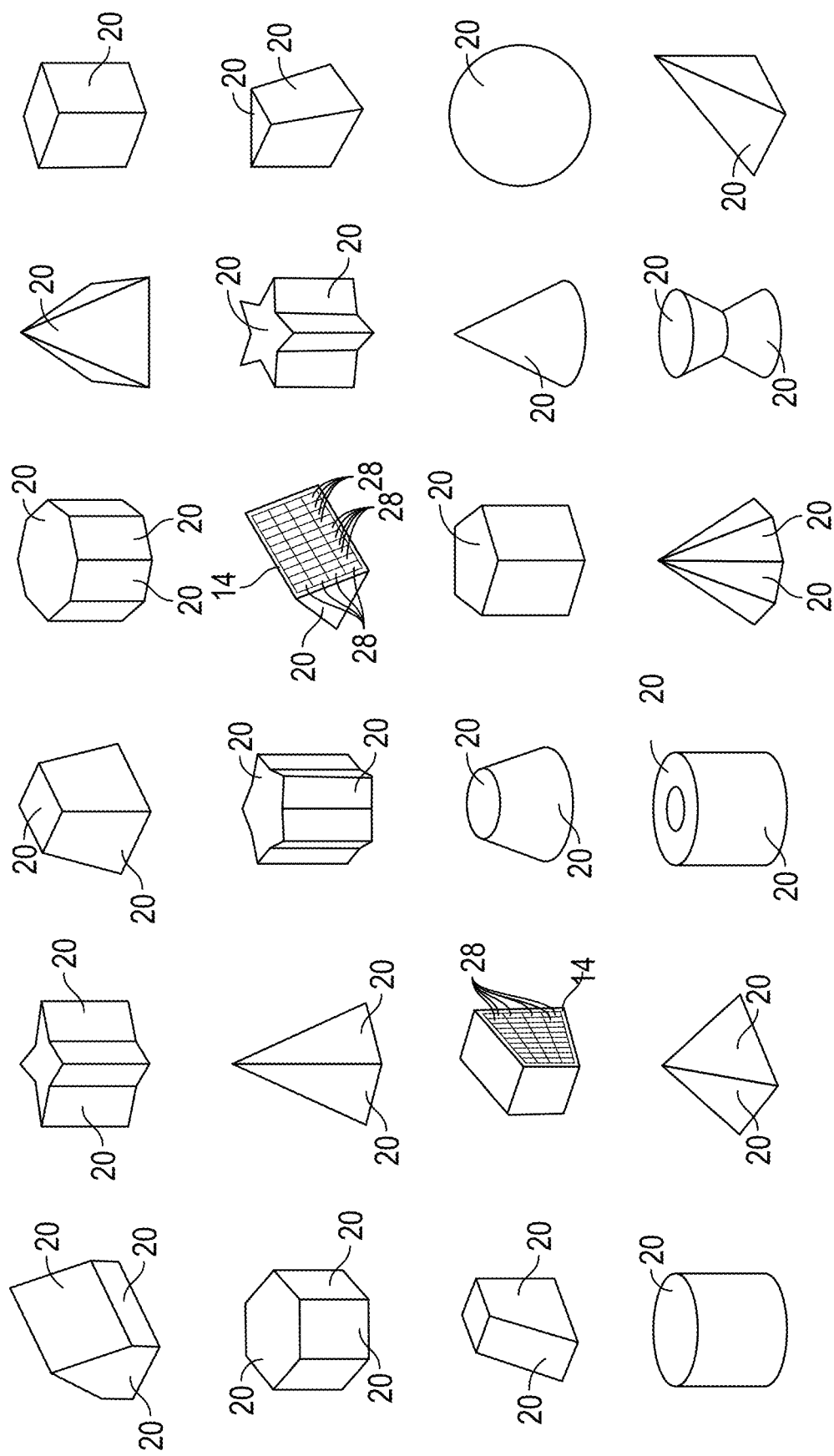
FIG. 17 is a schematic of exemplary embodiments of semiconductor wafers with solar cells on multi-dimensional surfaces in accordance with the present disclosure.
Figure 18:
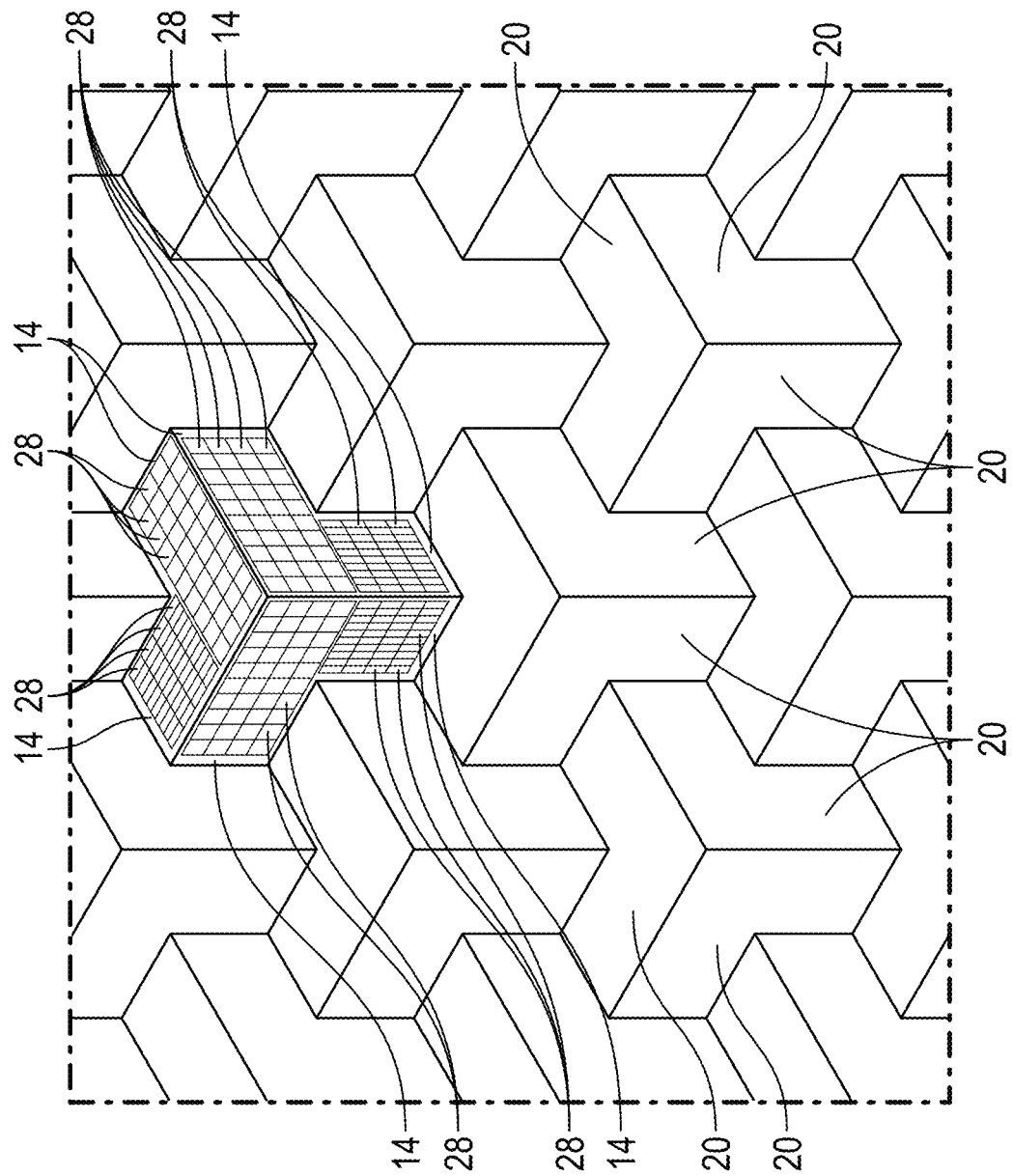
FIG. 18 is schematic of exemplary embodiments of multi-dimensional die and on-chip solar microcells structure in accordance with the present disclosure.

As shown in FIG. 15, wafers 14 of the integrated circuit 10 may include solar cells 28. More particularly, the semiconductor wafers 14 may be mounted on all planes 20 of the electronic package 18 and comprise non-silicon substrate on-chip solar cells 28. As best seen in FIGS. 16 and 17, in exemplary embodiments the semiconductor wafers 14 are mounted on selected planes 20 of the multi-dimensional structure and comprise silicon on-chip solar cells 28. FIG. 18 shows a multi-dimensional die and on-chip solar microcells structure. The semiconductor wafers could be mounted on all planes of the electronic package and comprise silicon MEMS and/or on-chip solar cells structure. The solar cells may be fully integrated within the integrated circuit structure for power harvesting. In exemplary embodiments, photo diodes, electrically connected, are used as on-chip micro solar cells.

Figure 19:
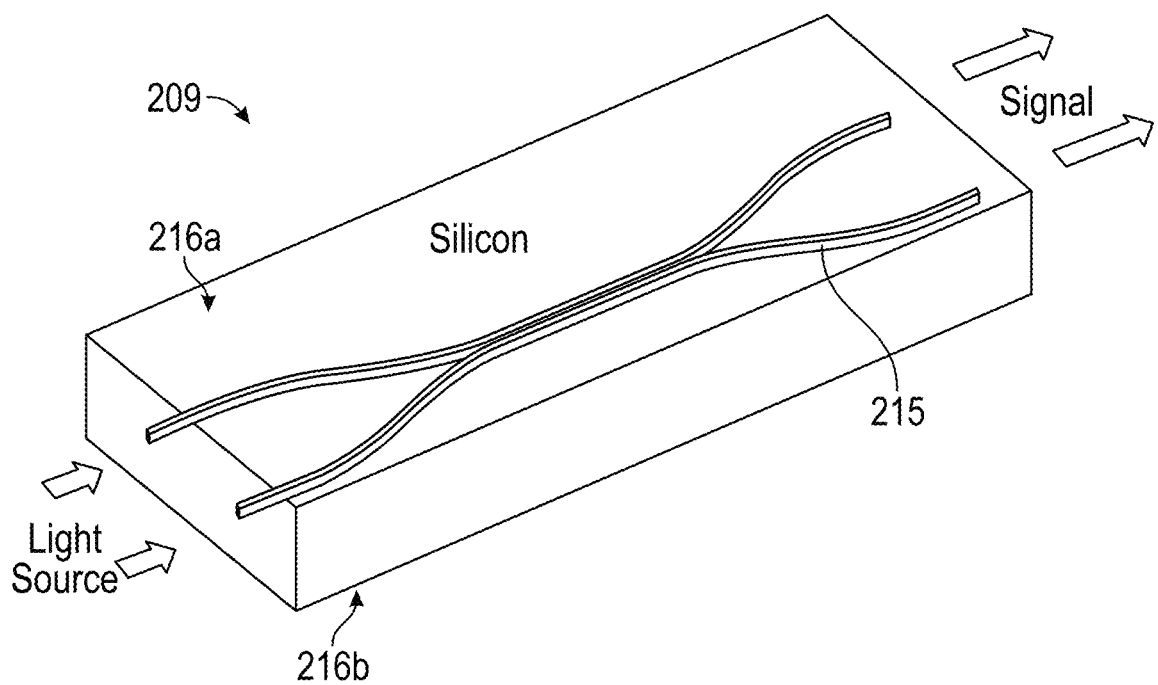
FIG. 19 is a perspective view of a photonic integrated circuit in accordance with the present disclosure.
Figure 20:
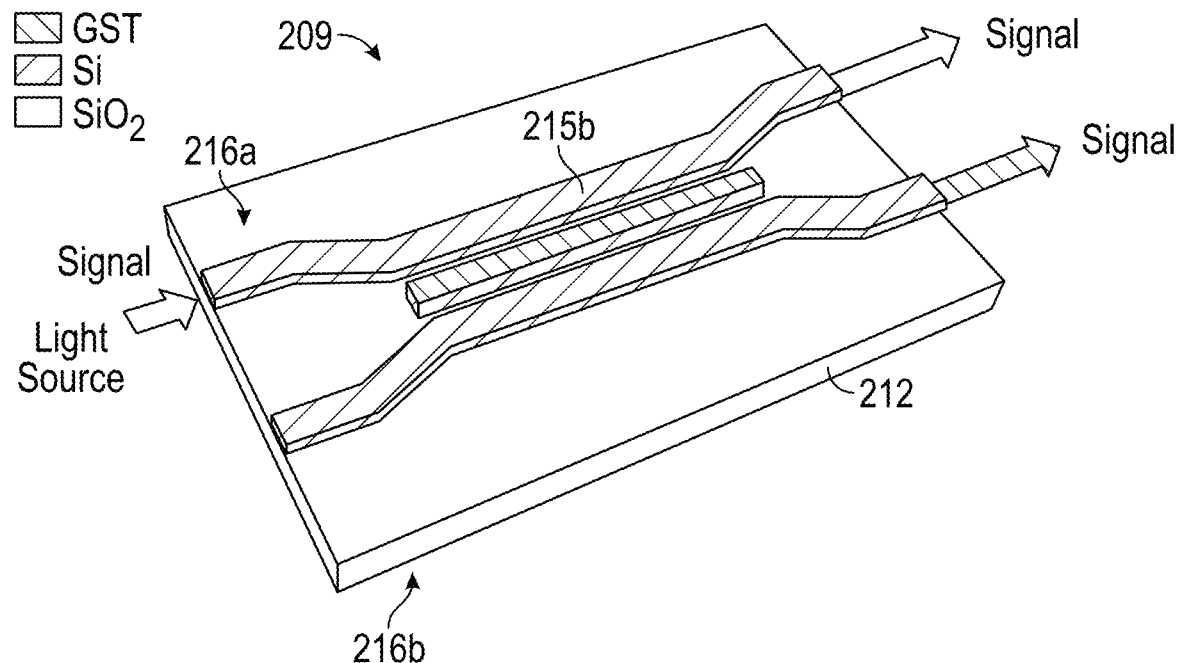
FIG. 20 is a perspective view of a photonic integrated circuit in accordance with the present disclosure.
Figure 21:
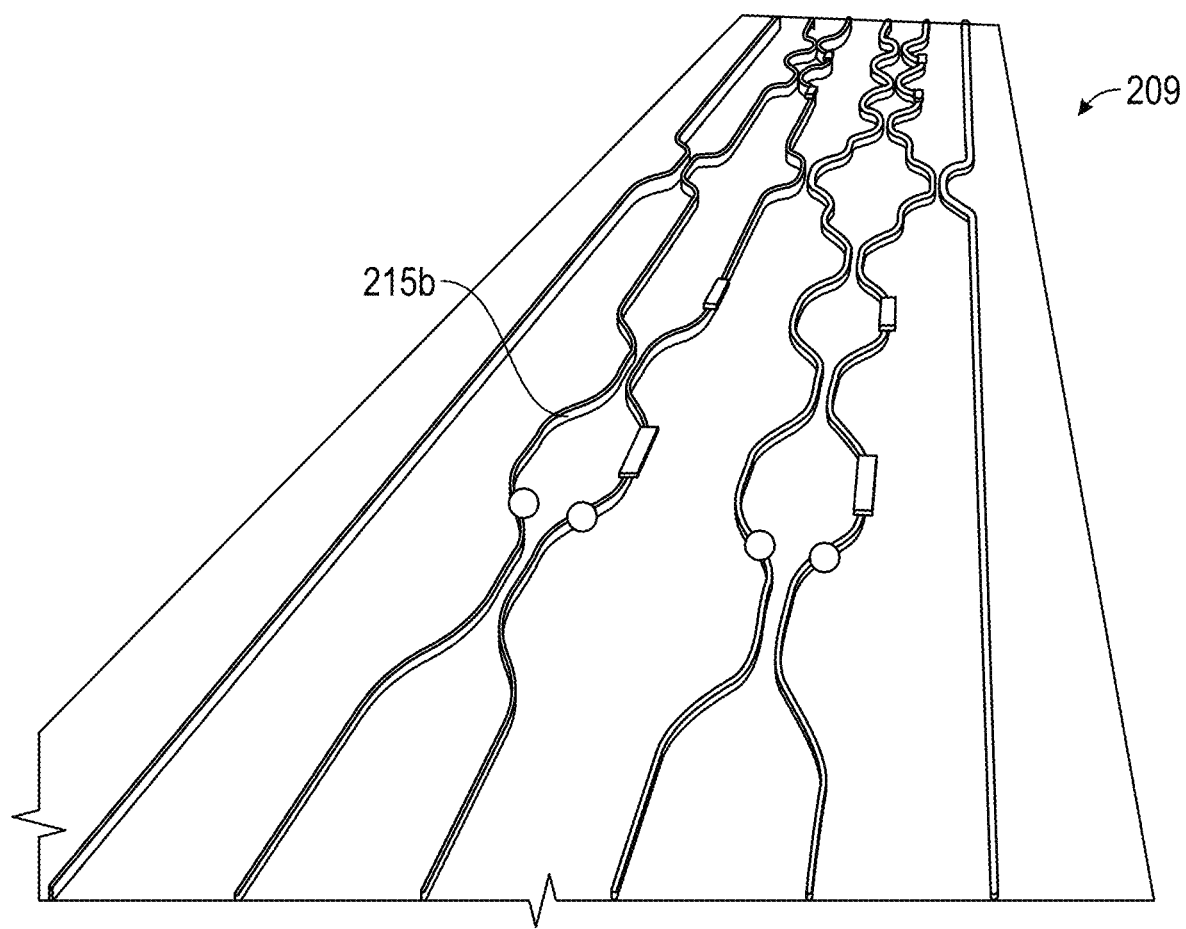
FIG. 21 is a perspective view of a photonic integrated circuit in accordance with the present disclosure.

With reference to FIGS. 19-26, exemplary embodiments of multi-dimensional photonic integrated circuits 210 will now be described. As illustrated in FIGS. 19-21, a photonic integrated circuit (PIC) 209 is a chip that contains photonic or optical components 215, i.e., components that work with light (photons). Whereas conventional integrated circuits work by conducting electricity or allowing electrons to flow through the circuit, PICs utilize photons, massless fundamental particles representing a quantum of light, instead of electrons. In a photonic chip, photons pass through optical components such as waveguides (equivalent to electrical wires), lasers (equivalent to transistors), and similar. PICs typically use a laser source to inject light that drives the components, like turning on/off a typical electron-based CMOS transistor. In a CMOS transistor, electrons are injected to drive electronic components as in PICs light is used instead of electrons. Photonic integrated circuits are typically fabricated with a wafer-scale technology using lithography on silicon related materials substrates.

An exemplary multi-dimensional photonic integrated circuit (MD PIC) 210 is comprised of a photonic integrated circuit 209 including a substrate 212 having two sides 216a, 216b and a multi-dimensional package 218 with planes 220 that extend in multiple dimensions. The planes 220 may have horizontal sides 213a and vertical sides 213b. Optical components 215 such as waveguides or lasers are mounted on or otherwise connected to one or both sides 216a, 216b of the package 218 as well as being mounted on the package's multi-dimensional planes 220 on the horizontal 213a and/or vertical sides 213b. In exemplary embodiments, at least one of the optical components 215 is mounted on at least one of the horizontal sides 213a, and another optical component 215 is mounted on at least one of the vertical sides 213b. The optical components 215 may be mounted on all the planes 220 of the package 218.

Figure 22:
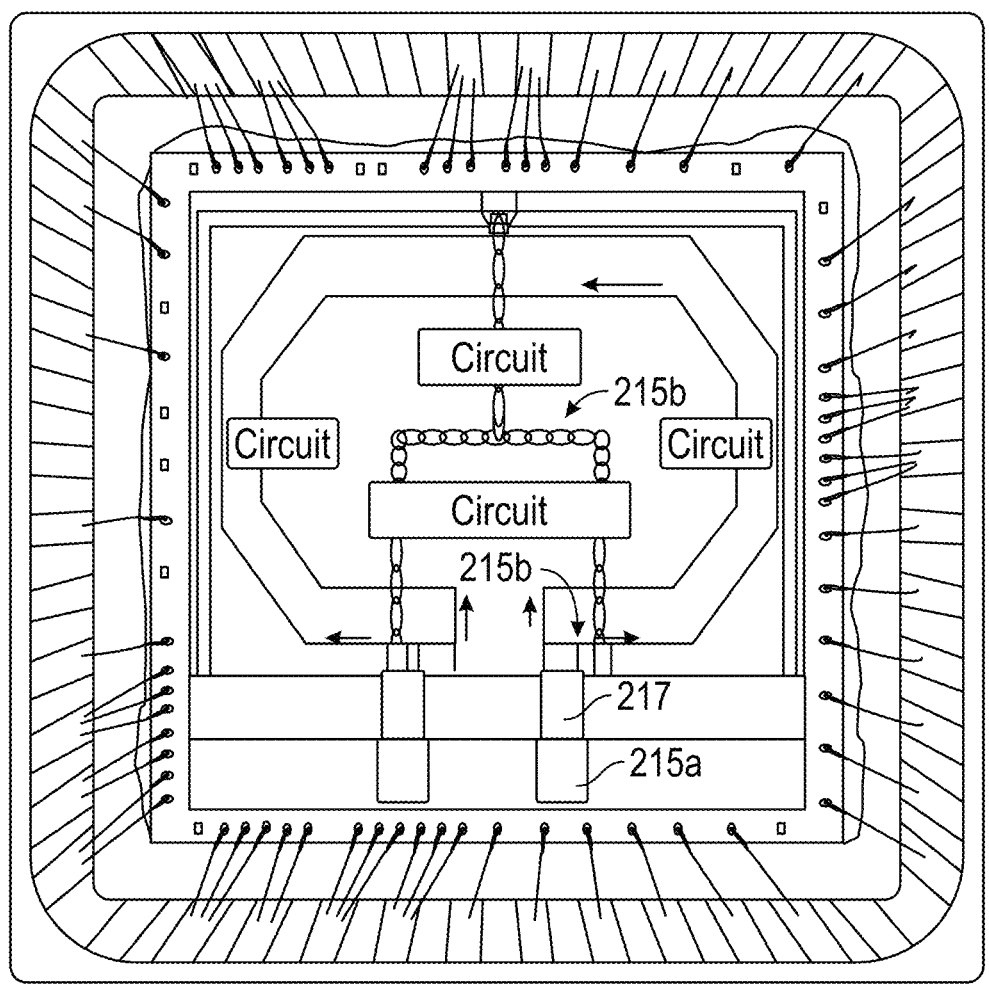
FIG. 22 is a front view of a photonic integrated circuit in accordance with the present disclosure.
Figure 23:
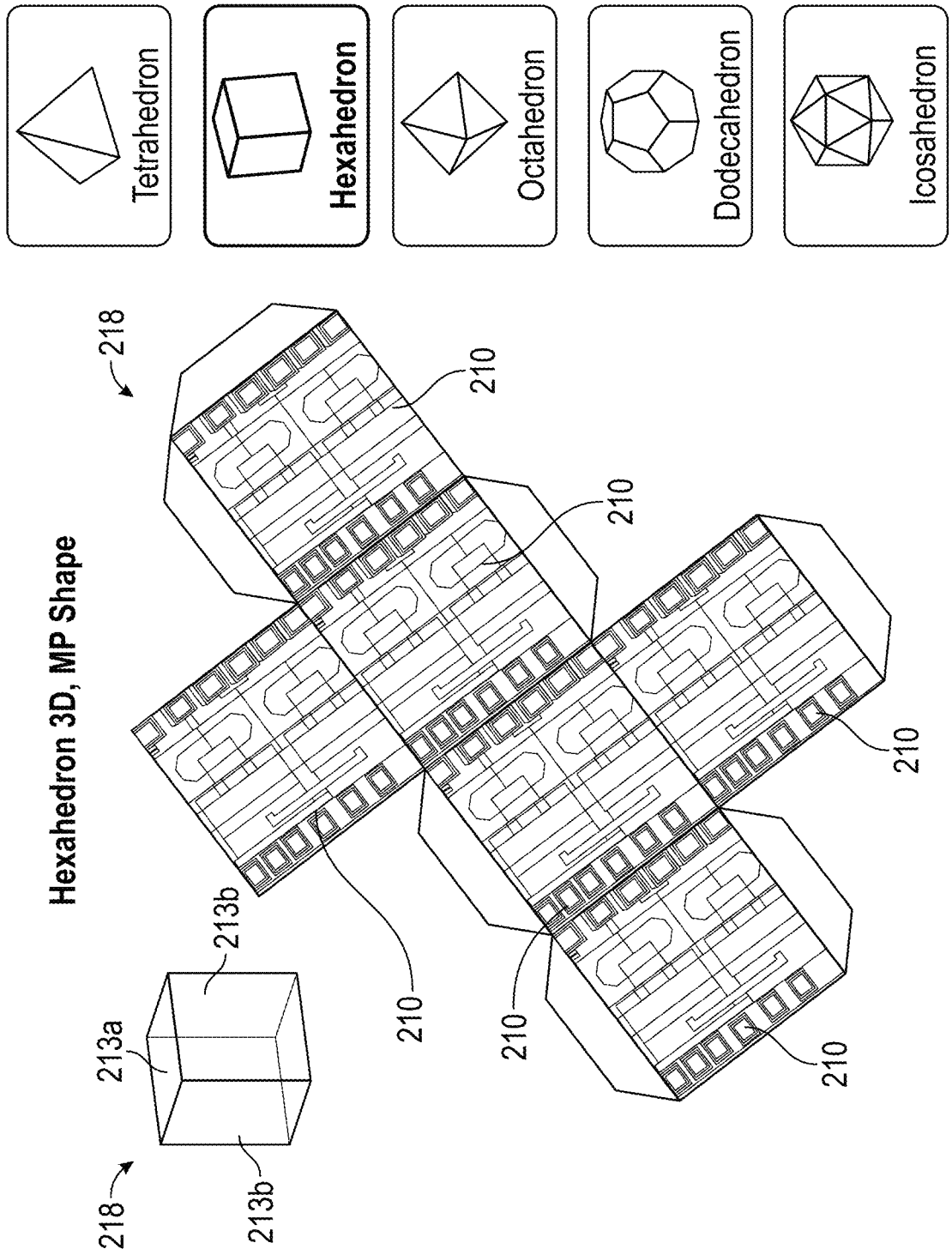
FIG. 23 is a perspective and detail view of a multi-dimensional photonic integrated circuit in accordance with the present disclosure.
Figure 24:
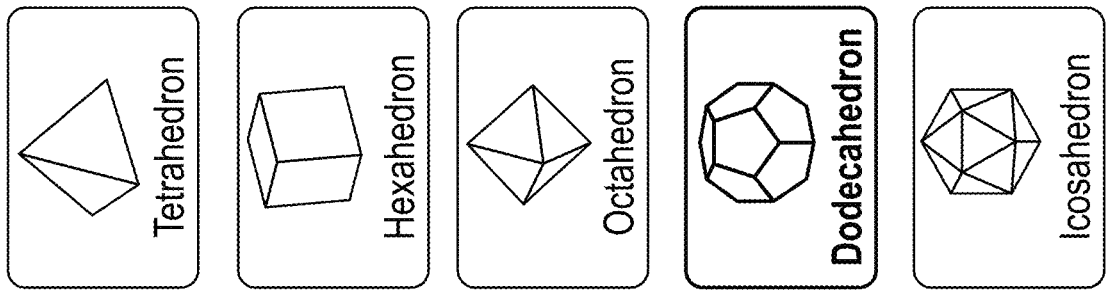
FIG. 24 is a perspective and detail view of a multi-dimensional photonic integrated circuit in accordance with the present disclosure.
Figure 24:
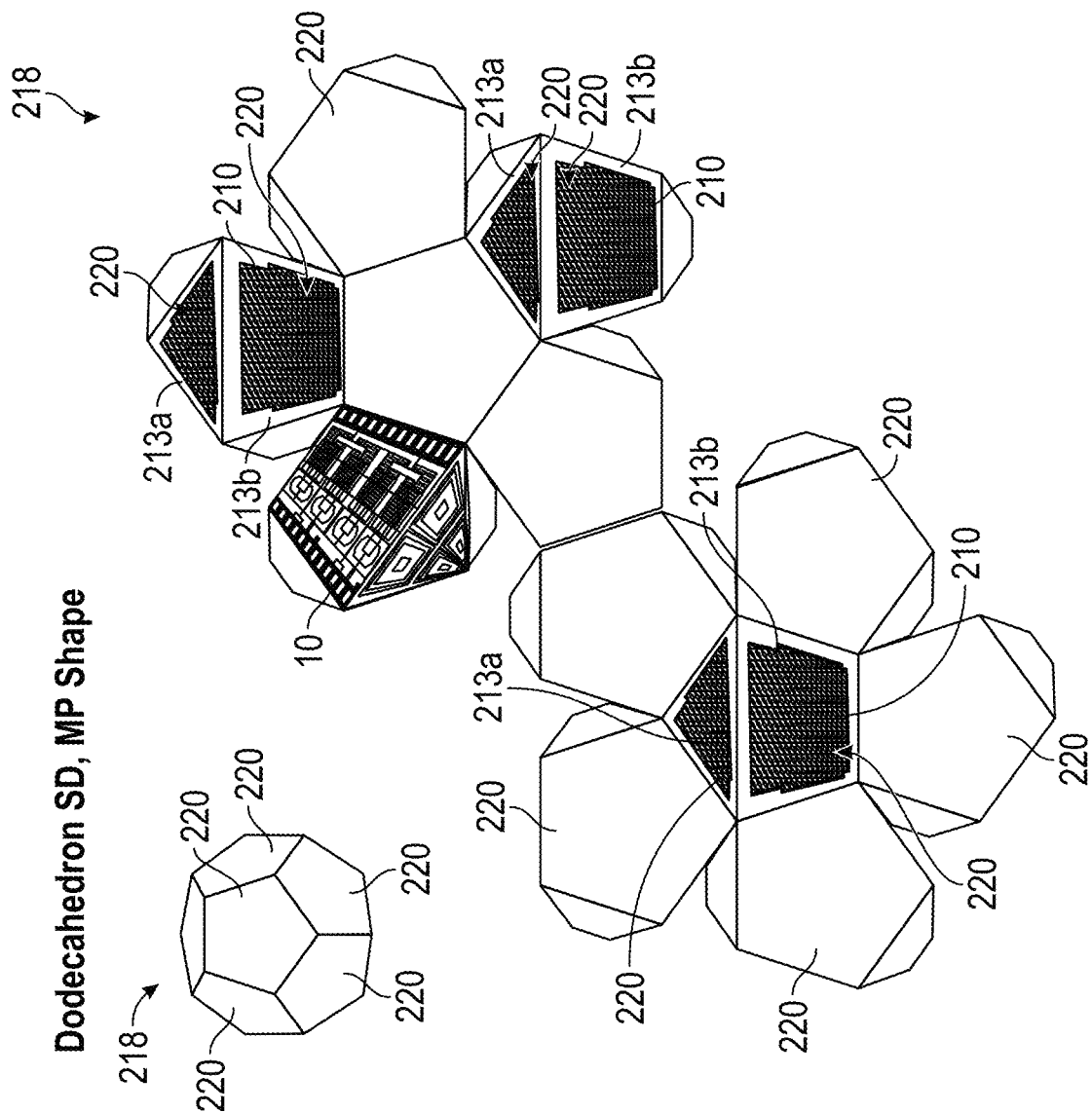
Figure 25:
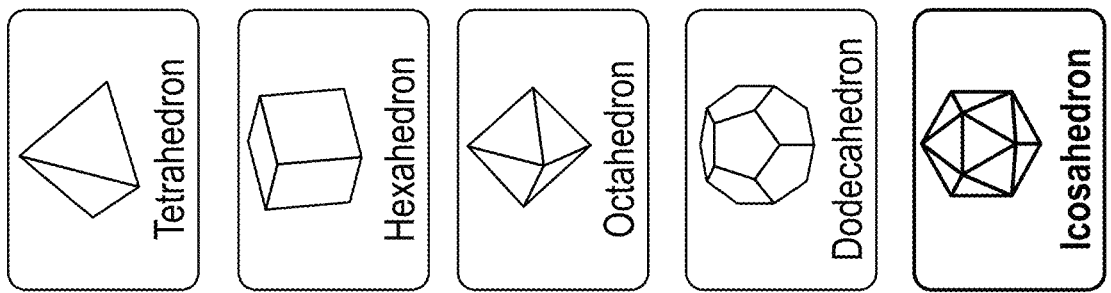
FIG. 25 is a perspective and detail view of a multi-dimensional photonic integrated circuit in accordance with the present disclosure.
Figure 25:
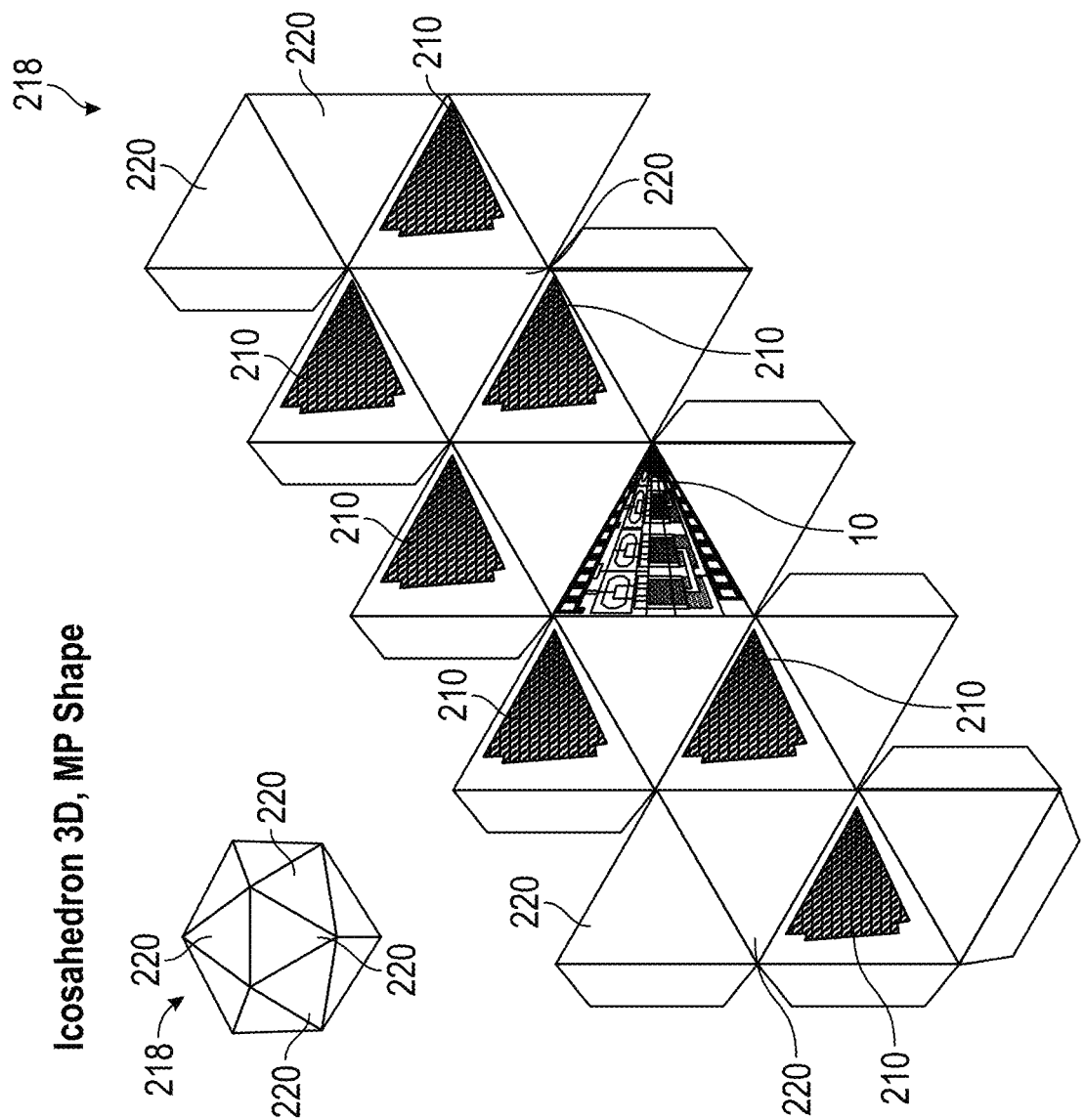
Figure 26:
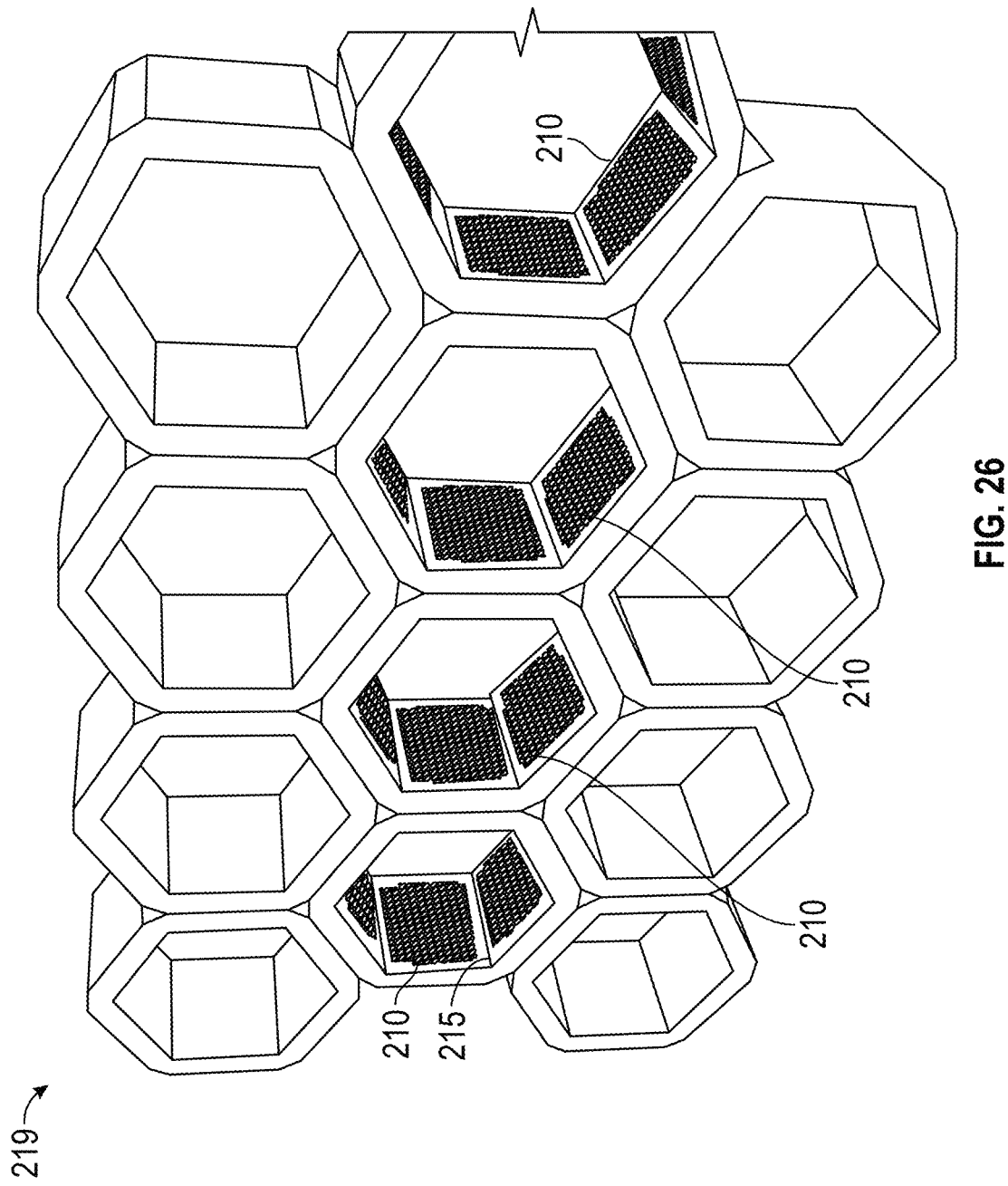
FIG. 26 is a perspective view of a multi-dimensional photonic integrated circuit in accordance with the present disclosure.

As best seen in FIGS. 19 and 22, the optical components 215 of a PIC 209 include a laser 215a and one or more optical waveguides 215b. A laser injects light into the PIC 209 to drive the other optical components 215, and the waveguides guide the light, restricting the spatial region where the photons can propagate. This enables the PIC 209 to operate using the photons of light. The optical components 215 may be connected by optical fiber 217 that runs throughout the PIC 209.

As shown in FIGS. 23-26, the multi-dimensional planes 220 of the package 218 can be of various structures such as hexahedron, dodecahedron, icosahedron, and can have a honeycomb/beehive structure 219. This advantageously enables shorter, more efficient MIV structure. The optical components 215 can be placed on the honeycomb planes. Implementation of this type of structural design significantly increases the surface area for memory cells implementation. The multi-planar, multi-dimensional memory layout surface design advantageously enables significantly larger capacity to implement more memory cells on the same area.

Figure 27:
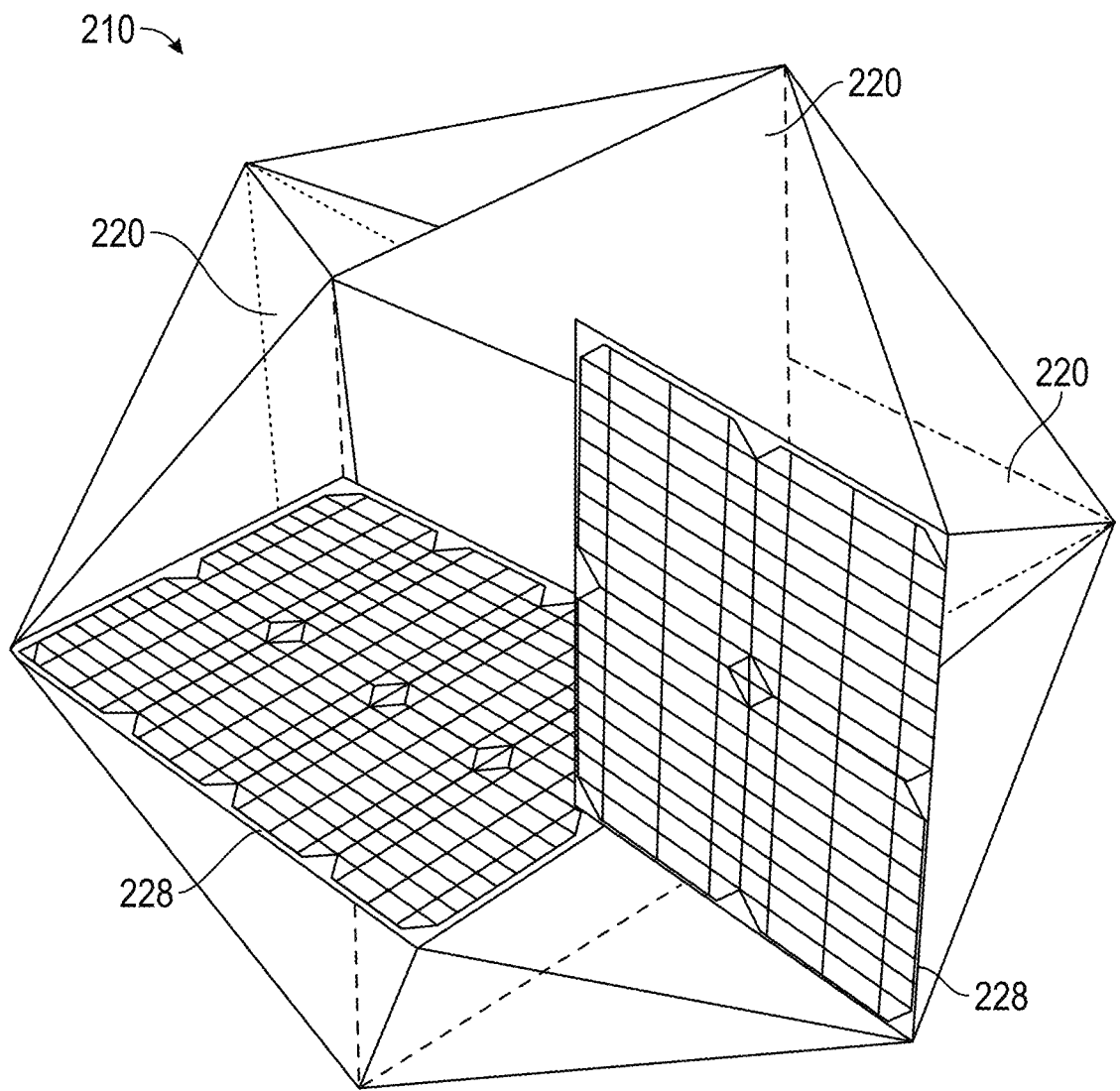
FIG. 27 is a perspective and detail view of a multi-dimensional photonic integrated circuit with on-chip solar cells in accordance with the present disclosure.
Figure 28:
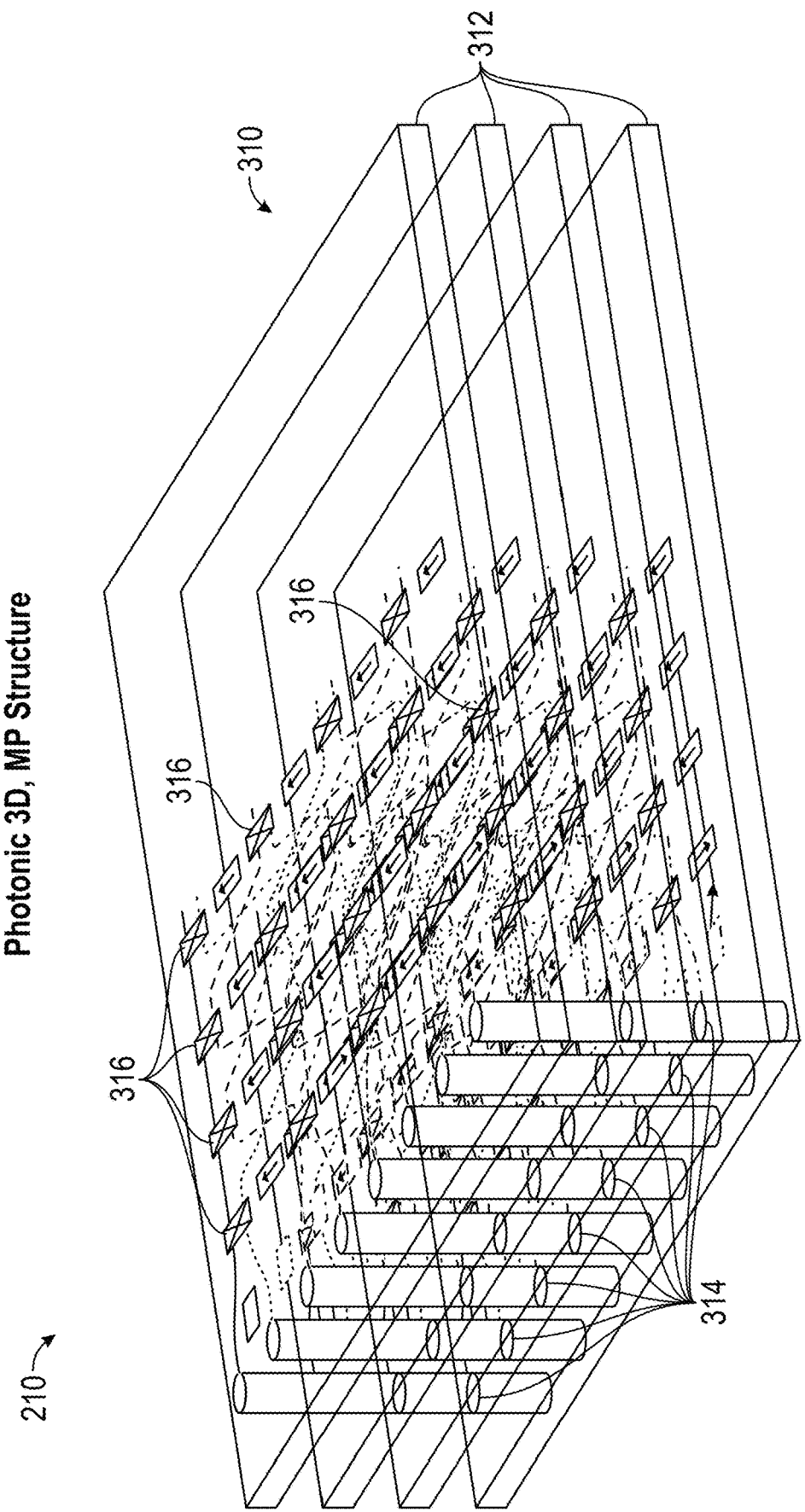
FIG. 28 is a detail view of a monolithic multi-dimensional memory architecture incorporated into a multi-dimensional photonic integrated circuit in accordance with the present disclosure.
Figure 29:
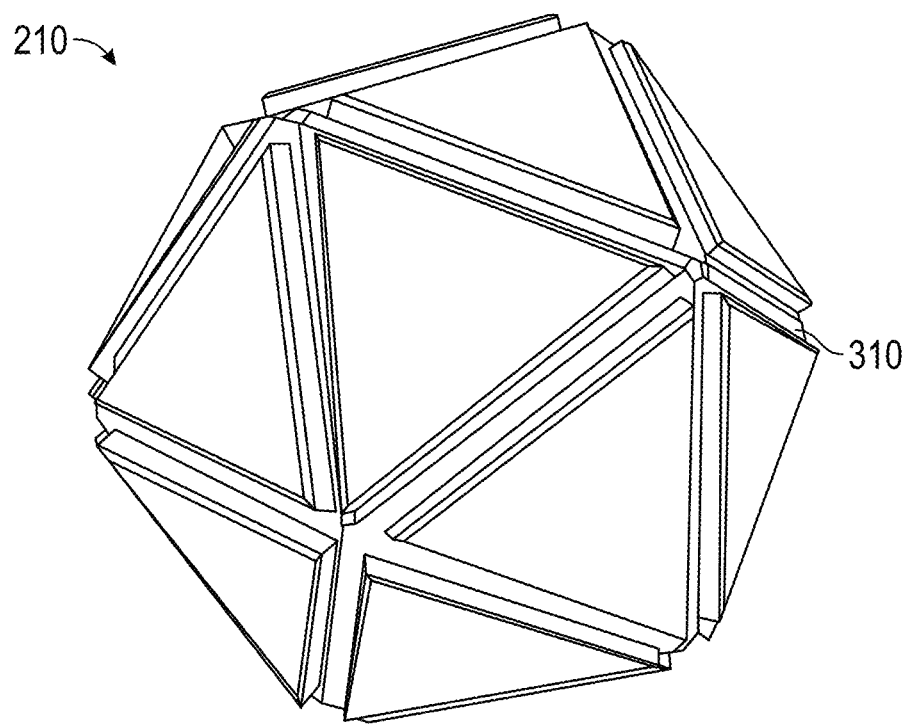
FIG. 29 is a perspective view of a monolithic multi-dimensional memory architecture incorporated into a multi-dimensional photonic integrated circuit in accordance with the present disclosure.
Figure 30:
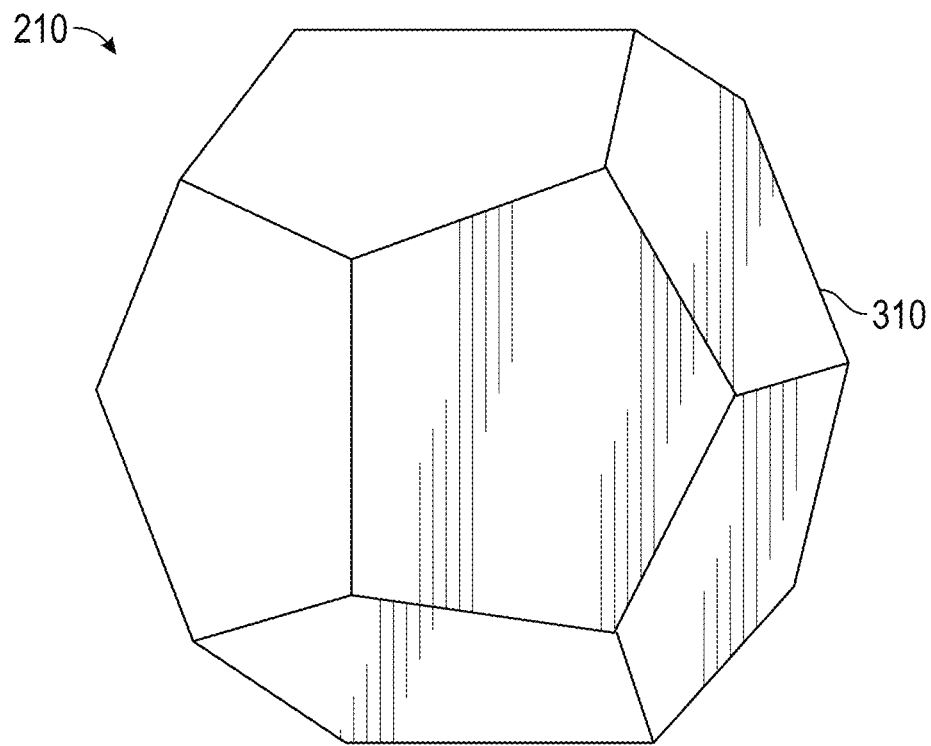
FIG. 30 is a perspective view of a monolithic multi-dimensional memory architecture incorporated into a multi-dimensional photonic integrated circuit in accordance with the present disclosure.
Figure 31:
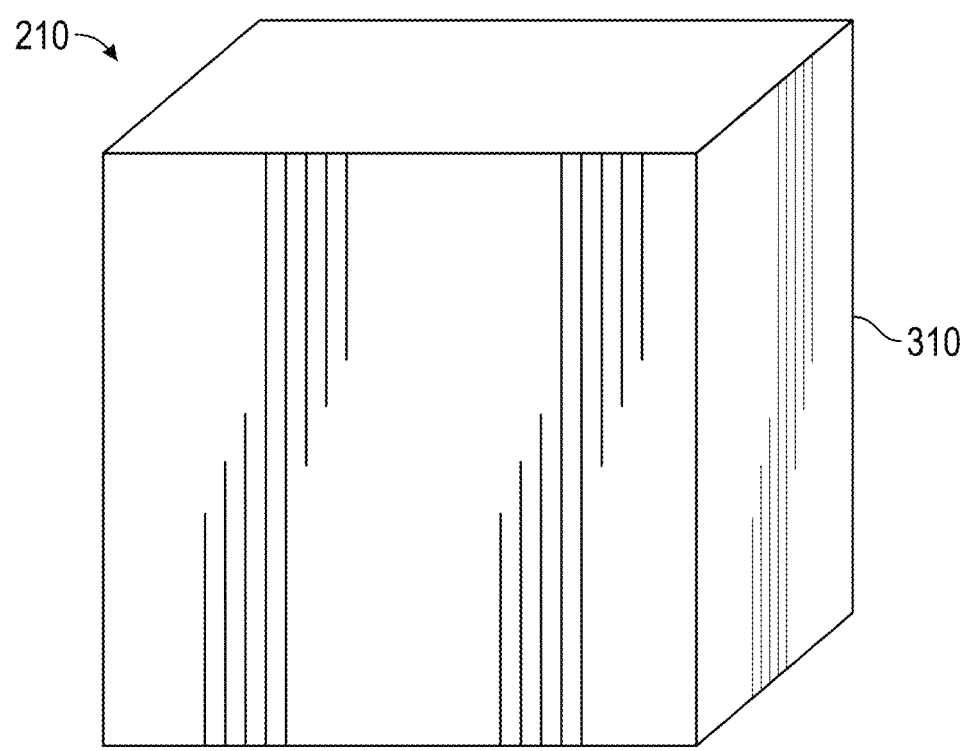
FIG. 31 is a perspective view of a monolithic multi-dimensional memory architecture incorporated into a multi-dimensional photonic integrated circuit in accordance with the present disclosure.

Turning to FIG. 27, it can be seen that exemplary multi-dimensional photonic integrated circuits 210 incorporate solar cells. On-chip solar cells and/or MEMS can be mounted on or incorporated into the multiple-planes described above. The solar cells 228 may be mounted on all planes 220 of the package 218 and comprise silicon or non-silicon substrate on-chip solar cells. The solar cells 228 may be fully integrated within the photonic circuit structure for power harvesting.

With reference to FIGS. 28-31, the multi-dimensional photonic integrated circuit 210 can include multi-dimensional memory architecture 310, which is comprised of a multi-dimensional, multiple plane memory crossbar architecture with tight-pitched vertical, horizontal, and angled monolithic inter-tier vias (MIVs) 314 for inter-unit routing. There may be multiplexers at each tier for block access used to shorten overall conductor length and reduce resistive-capacitive (RC) delay. Exemplary embodiments have one or more tiers or planes 312 and monolithic inter-tier vias 314 spanning the tiers.

In exemplary embodiments, there is at least one memory cell 316 in each tier or plane 312 and the memory cell 316 may be located within a client memory unit. At least one tier memory unit may lie in planes perpendicular to the other memory units and/or in planes parallel to the other memory units and/or in planes at any angle to the other memory units. A basic structure would have at least one horizontal crossbar for memory cells 316 within tiers 312. The memory cells 316 may have random access memory (RAM), and the RAM may comprise static RAM (SRAM). In exemplary embodiments, one or more of the memory cells 316 could have a three-dimensional mask-programmed read-only memory (3D-MPROM) or a three-dimensional electrically-programmable read-only memory (3D-EPROM).

Figure 32:
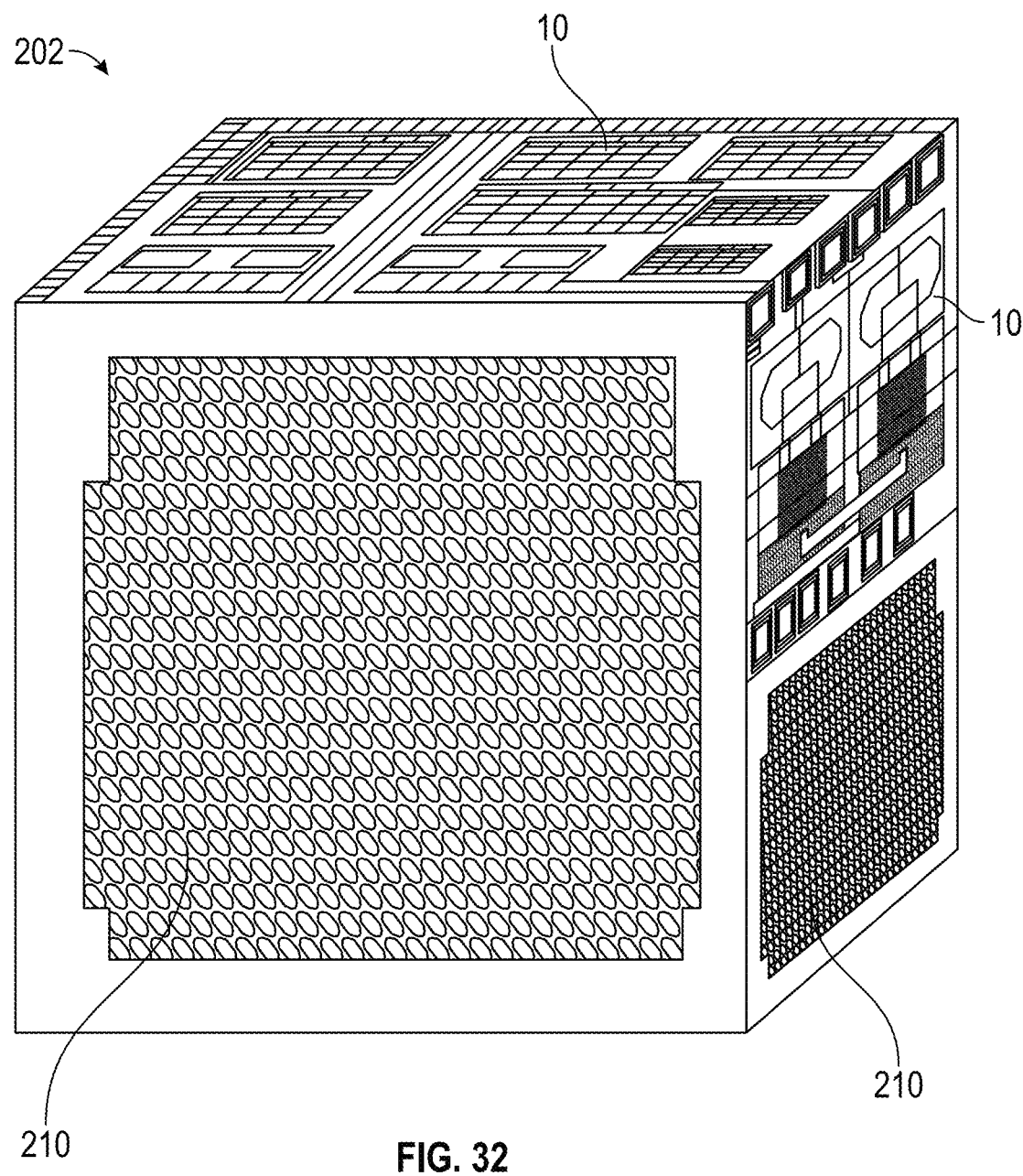
FIG. 32 is a perspective view of a hybrid system of multi-dimensional integrated circuits and multi-dimensional photonic integrated circuits in accordance with the present disclosure.
Figure 33:
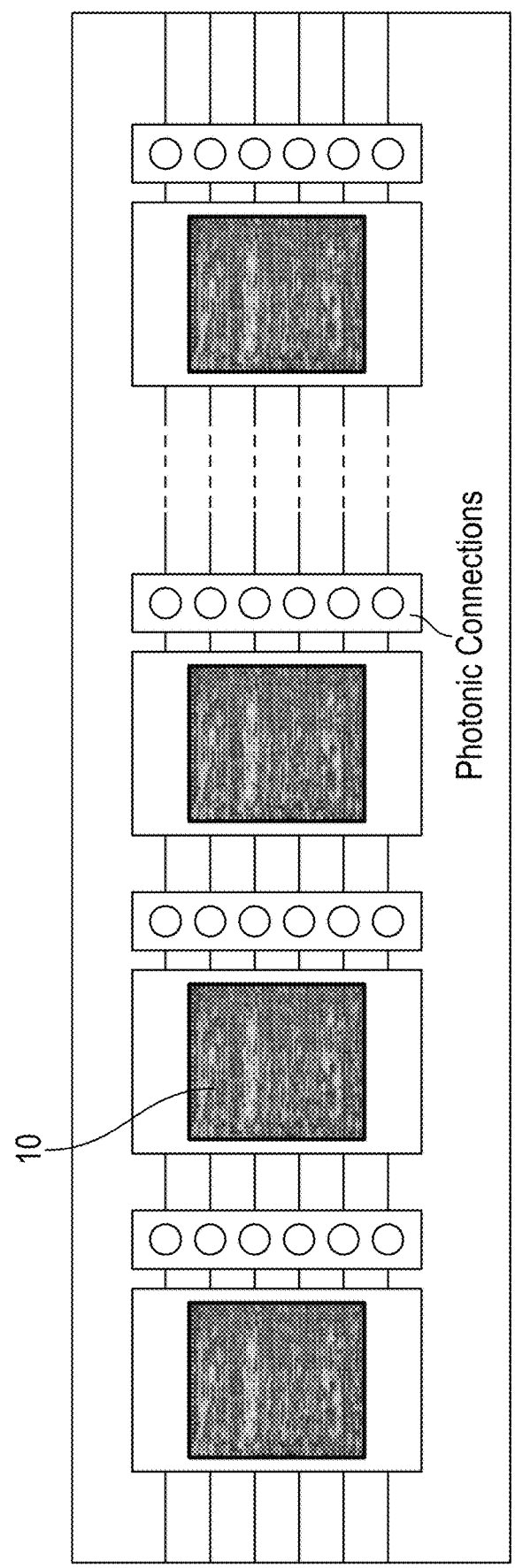
FIG. 33 is a diagram showing communication between multi-dimensional integrated circuits and multi-dimensional photonic integrated circuits in accordance with the present disclosure.

With reference to FIGS. 32 and 33, a hybrid system 202 of conventional multi-dimensional integrated circuits 10 and multi-dimensional photonic integrated circuits 210 is provided. The multi-dimensional integrated circuit 10 communicates with the multi-dimensional photonic integrated circuit 210 by electrical communication and/or photonic communication. In exemplary embodiments, the conventional 3D, MP circuitries/chip 10 communicates with the photonic circuitries/chip 210 via optical based wiring connections. For example, microfiber optics may function as light-based-wires. Another option is light conducting wires that are like fiber optics in structure but embedded into the silicon substrate. It should be noted that any type of light conducting material that functions as wire and can be implemented within a microchip could be used.

Figure 34:
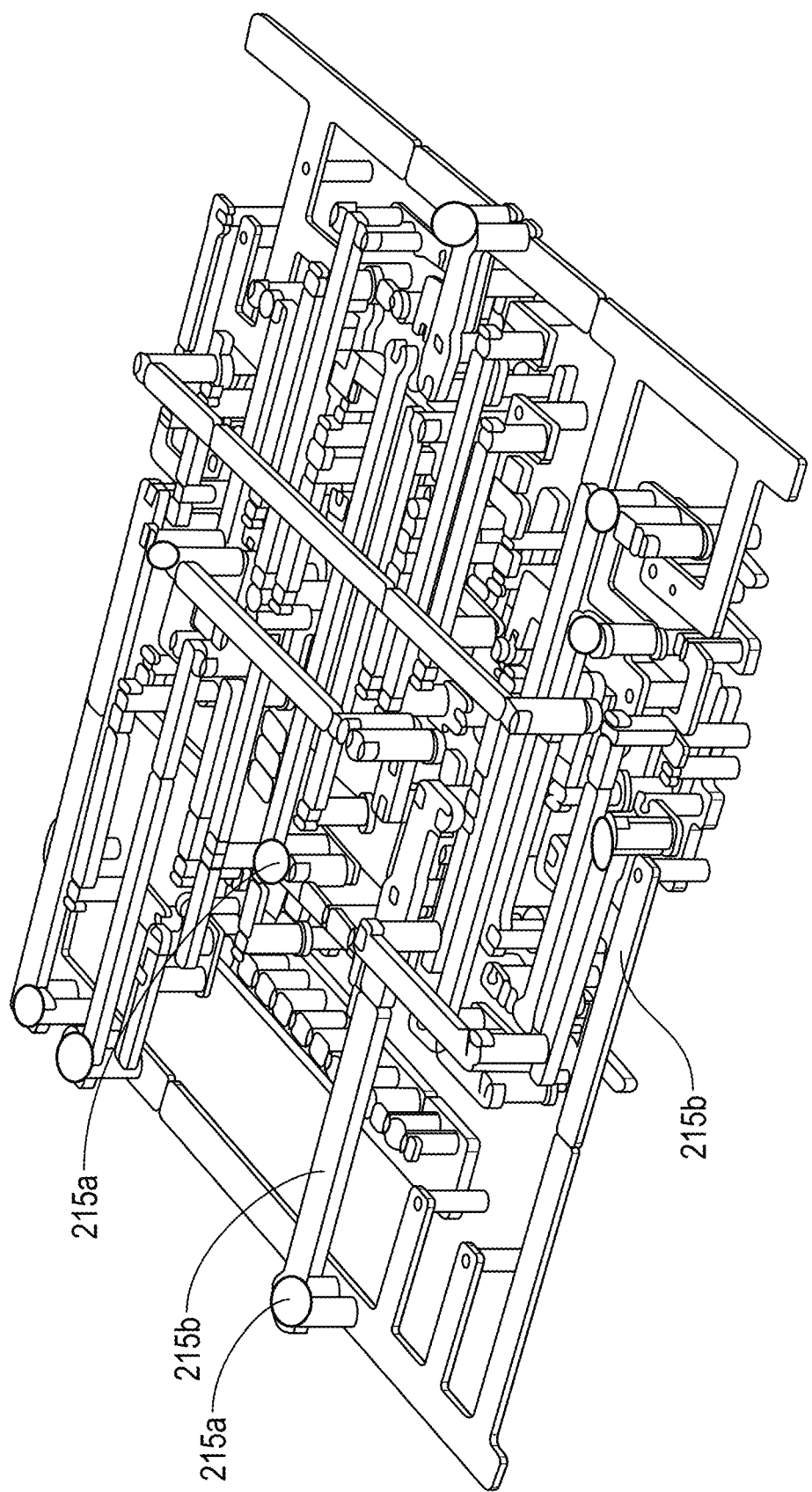
FIG. 34 is a perspective view of a multi-dimensional photonic integrated circuit being fabricated in accordance with the present disclosure.

The signals are transmitted using a light source such as a laser 215a, high intensity LEDs, or any other similar light source. It should be noted that one advantage of the multi-dimensional photonic integrated circuits 210 is that fiber optics or any other light oriented medium that is functioning as wire can be bent according to the 3D, MP shape and enable electrical connectivity. These and other modifications could be done during fabrication of a multi-dimension PIC, a stage of which is shown in FIG. 34. Dedicated circuitries are made to produce the light-based communication between circuits and can transmit the signals in different frequencies. This feature enables multiplexing capabilities, meaning transmitting different data on the same light wire as a frequency dependent. For example, on one light-based wire using one frequency specific data can be transmitted and using different frequency will transmit another data. The light pulses can alternate and transmit many data to many circuitries or components on the same line, very similar to transmitting data signals over high power lines for example.

As described in detail above, multi-dimensional integrated circuit 10 comprises an electronic board 12 and one or more semiconductor wafers 14. The electronic board 12 has two opposite sides 16a, 16b, and IC 10 and wafers 14 are mounted on both sides 16a, 16b of the board 12. The semiconductor wafers 14 may be mounted on one or more of the planes 20 of the electronic package 18 and may be mounted on all its planes. In exemplary embodiments, multiple ICs are constructed on one or more planes of the electronic package 18. A multi-dimensional electronic package 18 is provided and is comprised of multiple planes 20a-20d. Also described above, multi-dimensional PIC 210 has a substrate 212 with two sides 216a, 216b and a multi-dimensional package 218 with planes 220 that extend in multiple dimensions. Optical components 215 are mounted on one or both sides 216a, 216b of the package 218 as well as being mounted on the package's multi-dimensional planes 220.

A hybrid system is advantageous for many applications, including in the telecommunications industry where high-speed information is transmitted along fiber optic waveguides. The information must ultimately be converted into digital signals for common electronic devices to process since common data networks and power infrastructures exist on electrical structures and not photonic ones. As optical systems are more power efficient than electrical systems, PICs will likely continue replacing conventional ICs within a wide range of applications.

The silicon photonics market is projected to rapidly grow in the next few years. Therefore, it is likely that more photonic integrated circuits will replace conventional electric circuits in a wide range of industries including IoT, autonomous machines, data centers, high-performance computing, telecommunications, and medical applications.

Disclosed embodiments include and enable larger PICs, with higher performance and less energy/heat loss. These chips increase the traffic speed and bandwidth of data centers, reduce power consumption/heat, lowering cost, and ultimately helping create a "greener world". Embodiments of the present disclosure encapsulate the next generation of high performance, bandwidth, and efficiency of PICs, making them a vital part of the high-speed technology of the future.

Thus, it is seen that monolithic multi-dimensional integrated and photonic circuits and memory architectures are provided. It should be understood that any of the foregoing configurations and specialized components or connections may be interchangeably used with any of the systems of the preceding embodiments. Although illustrative embodiments are described hereinabove, it will be evident to one skilled in the art that various changes and modifications may be made therein without departing from the scope of the disclosure. It is intended in the appended claims to cover all such changes and modifications that fall within the true spirit and scope of the present disclosure.

What is claimed is:

1. A multi-dimensional photonic integrated circuit comprising:
   a substrate having a first side and a second side;

a multi-dimensional package having multi-dimensional planes, the multi-dimensional planes including one or more horizontal sides and one or more vertical sides; and one or more optical components connected to the first side and the second side of the substrate and on the multi-dimensional planes of the multi-dimensional package;

wherein one or more of the optical components are mounted on at least one of the horizontal sides of the multi-dimensional package and one or more of the optical components are mounted on at least one of the vertical sides of the multi-dimensional package.

2. The multi-dimensional photonic integrated circuit of claim 1 wherein the optical components are mounted on all planes of the multi-dimensional package.

3. The multi-dimensional photonic integrated circuit of claim 1 wherein the multi-dimensional planes have a honeycomb shape.

4. The multi-dimensional photonic integrated circuit of claim 1 wherein the optical components comprise one or more of: waveguides and lasers.

5. The multi-dimensional photonic integrated circuit of claim 1 wherein the optical components are connected via optical fiber.

6. The multi-dimensional photonic integrated circuit of claim 1 further comprising a laser source injecting light to drive the optical components.

7. The multi-dimensional photonic integrated circuit of claim 1 further comprising one or more solar cells integrated within the photonic integrated circuit or used as on-chip solar cells.

8. The multi-dimensional photonic integrated circuit of claim 7 wherein the one or more solar cells comprise one or more of: MEMS and on-chip solar cells.

9. The multi-dimensional photonic integrated circuit of claim 1 further comprising a monolithic multi-dimensional memory architecture, the monolithic multi-dimensional memory architecture comprising:
   one or more tiers, each tier having at least one memory cell;
   one or more monolithic inter-tier vias spanning the one or more tiers;
   at least one multiplexer disposed in one of the tiers, the multiplexer being communicatively coupled to the memory cell in the respective tier; and
   control logic determining whether memory cells are active and which memory cells are active and controlling usage of the memory cells based on such determinations.

10. The multi-dimensional photonic integrated circuit of claim 1 further comprising a light source comprised of one or more of: a laser, an LED, or a high-intensity LED.

11. The multi-dimensional photonic integrated circuit of claim 1 wherein the multi-dimensional photonic integrated circuit is configured to multiplex signals.

12. A multi-dimensional photonic integrated circuit comprising:
   a substrate having a first side and a second side;
   a multi-dimensional electronic package having multiple planes; and
   one or more optical components connected to the first side and the second side of the substrate and on the multiple planes of the electronic package;
   wherein the multiple planes have a honeycomb shape.

13. The multi-dimensional photonic integrated circuit of claim 12 wherein the optical components are mounted on all planes of the electronic package.

14. The multi-dimensional photonic integrated circuit of claim 12 wherein the optical components are connected via optical fiber.

15. The multi-dimensional photonic integrated circuit of claim 12 further comprising a laser source injecting light to drive the optical components.

16. A hybrid system of conventional multi-dimensional integrated circuits and multi-dimensional photonic integrated circuits comprising:
   at least one multi-dimensional integrated circuit including an electronic board having a first side and a second side, a multi-dimensional electronic package having multiple planes, and one or more semiconductor wafers mounted on the multiple planes of the first side and the second side of the electronic board; and
   at least one multi-dimensional photonic integrated circuit including a substrate having a first side and a second side, a multi-dimensional package having multiple planes, and one or more optical components including one or more of: waveguides and lasers, the optical components being connected to the first side and the second side of the substrate and on the multiple planes of the multi-dimensional package;
   wherein the at least one multi-dimensional photonic integrated circuit is in communication with the at least one multi-dimensional integrated circuit via an optical-based wiring connection and dedicated circuitries facilitating light-based communication between the at least one multi-dimensional photonic integrated circuit and the at least one multi-dimensional integrated circuit.

17. The hybrid system of claim 16 wherein the multiple planes of the multi-dimensional electronic package include one or more horizontal sides and one or more vertical sides; and
   wherein one or more of the semiconductor wafers are mounted on at least one of the horizontal sides of the multi-dimensional electronic package and one or more of the semiconductor wafers are mounted on at least one of the vertical sides of the multi-dimensional electronic package.

18. The hybrid system of claim 16 wherein the multiple planes of the multi-dimensional package include one or more horizontal sides and one or more vertical sides; and
   wherein one or more of the optical components are mounted on at least one of the horizontal sides of the multi-dimensional package and one or more of the optical components are mounted on at least one of the vertical sides of the multi-dimensional package.

19. The hybrid system of claim 16 wherein the multiple planes of the multi-dimensional electronic package have a honeycomb shape.

20. The hybrid system of claim 16 wherein the optical components are mounted on all planes of the multi-dimensional package.

21. The hybrid system of claim 16 wherein the optical-based wiring connection comprises one or more of: microfiber optics functioning as light-based wires or light-conducting wires embedded into the substrate.

* * * * *